US011296110B2

(12) United States Patent
Jung et al.

(10) Patent No.: US 11,296,110 B2
(45) Date of Patent: Apr. 5, 2022

(54) NONVOLATILE MEMORY DEVICE AND METHOD FOR FABRICATING THE SAME

(71) Applicant: SAMSUNG ELECTRONICS CO., LTD., Suwon-si (KR)

(72) Inventors: Kwang Young Jung, Hwaseong-si (KR); Jong Won Kim, Hwaseong-si (KR); Young Hwan Son, Hwaseong-si (KR); Jee Hoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 16/797,884

(22) Filed: Feb. 21, 2020

(65) Prior Publication Data
US 2020/0388633 A1 Dec. 10, 2020

(30) Foreign Application Priority Data

Jun. 10, 2019 (KR) .......................... 10-2019-0067910

(51) Int. Cl.
H01L 27/11582 (2017.01)
H01L 27/1157 (2017.01)
H01L 27/11565 (2017.01)
H01L 29/423 (2006.01)

(52) U.S. Cl.
CPC .... H01L 27/11582 (2013.01); H01L 27/1157 (2013.01); H01L 27/11565 (2013.01); H01L 29/42348 (2013.01)

(58) Field of Classification Search
CPC .......... H01L 27/11578–11582; H01L 29/4234
See application file for complete search history.

(56) References Cited

U.S. PATENT DOCUMENTS

| 8,437,192 | B2 | 5/2013 | Lung et al. |
| 8,786,004 | B2 | 7/2014 | Park et al. |
| 9,349,745 | B2 | 5/2016 | Lue |
| 9,728,546 | B2 | 8/2017 | Serov et al. |
| 9,812,462 | B1 | 11/2017 | Pang et al. |
| 9,831,257 | B2 | 11/2017 | Lue |
| 2009/0321813 | A1* | 12/2009 | Kidoh ............... H01L 27/11582 257/324 |

(Continued)

FOREIGN PATENT DOCUMENTS

JP 2011-23586 2/2011

Primary Examiner — Zandra V Smith
Assistant Examiner — Molly K Reida
(74) Attorney, Agent, or Firm — F. Chau & Associates, LLC

(57) ABSTRACT

A nonvolatile memory device includes a mold structure including a plurality of insulating patterns and a plurality of gate electrodes alternately stacked on a substrate, a semiconductor pattern penetrating through the mold structure and contacting the substrate, a first charge storage film, and a second charge storage film separated from the first charge storage film. The first and second charge storage films are disposed between each of the gate electrodes and the semiconductor pattern. Each of the gate electrodes includes a first recess and a second recess which are respectively recessed inward from a side surface of the gate electrodes. The first charge storage film fills at least a portion of the first recess, and the second charge storage film fills at least a portion of the second recess.

20 Claims, 32 Drawing Sheets

(56) References Cited

U.S. PATENT DOCUMENTS

2010/0034028 A1* 2/2010 Katsumata ........ H01L 27/11582
365/185.28
2018/0033799 A1 2/2018 Kanamori et al.

* cited by examiner

NONVOLATILE MEMORY DEVICE AND METHOD FOR FABRICATING THE SAME

CROSS-REFERENCE TO RELATED APPLICATIONS

This application claims priority under 35 U.S.C. § 119 to Korean Patent Application No. 10-2019-0067910, filed on Jun. 10, 2019, the disclosure of which is incorporated by reference herein in its entirety.

TECHNICAL FIELD

Exemplary embodiments of the present disclosure relate to a nonvolatile memory device and a method for fabricating the same. More specifically, exemplary embodiments of the present disclosure relate to a nonvolatile memory device including an isolated charge storage film and a method for fabricating the same.

DISCUSSION OF THE RELATED ART

A semiconductor memory device is a memory device implemented using a semiconductor material such as, for example, silicon (Si), germanium (Ge), gallium arsenide (GaAs), or indium phosphide (InP). A semiconductor memory device may be categorized as a volatile memory device or a nonvolatile memory device.

A volatile memory device is a memory device whose stored data is lost upon a loss of power. A volatile memory device may include, for example, static RAM (SRAM), dynamic RAM (DRAM), or synchronous DRAM (SDRAM). A nonvolatile memory device is a memory device that retains its stored data even when it is powered off. A nonvolatile memory device may include, for example, a flash memory device, read only memory (ROM), programmable ROM (PROM), electrically programmable ROM (EPROM), electrically erasable and programmable ROM (EEPROM), a resistive memory device (e.g., phase-change RAM (PRAM)), ferroelectric RAM (FRAM), or resistive RAM (RRAM).

The integration density of nonvolatile memory devices is increasing in order to meet customer demands for better performance and lower cost. However, in a two-dimensional (2D) or planar memory device, the integration density is determined by (and thus limited by) the area occupied by unit memory cells. Therefore, in recent years, a three-dimensional (3D) memory device with a vertical arrangement of unit memory cells has been developed.

SUMMARY

Exemplary embodiments of the present disclosure provide a nonvolatile memory device having improved integration density including the formation of two charge storage films per word line.

Exemplary embodiments of the present disclosure further provide a method for fabricating a nonvolatile memory device having improved integration density including the formation of two charge storage films per word line.

According to an exemplary embodiment of the present disclosure, a nonvolatile memory device includes a mold structure including a plurality of insulating patterns and a plurality of gate electrodes alternately stacked on a substrate, a semiconductor pattern penetrating through the mold structure and contacting the substrate, a first charge storage film, and a second charge storage film. The second charge storage film is separated from the first charge storage film. The first charge storage film and the second charge storage film are disposed between each of the gate electrodes and the semiconductor pattern. Each of the gate electrodes includes a first recess and a second recess which are respectively recessed inward from a side surface of the gate electrodes. The first charge storage film fills at least a portion of the first recess, and the second charge storage film fills at least a portion of the second recess.

According to an exemplary embodiment of the present disclosure, a nonvolatile memory device includes a mold structure including a plurality of insulating patterns and a plurality of gate electrodes alternately stacked on a substrate. Each of the gate electrodes includes first to third portions which are sequentially stacked. The nonvolatile memory device further includes a semiconductor pattern penetrating through the mold structure and contacting the substrate, a first charge storage film disposed between the first portion and the semiconductor pattern, and a second charge storage film disposed between the third portion and the semiconductor pattern. A side surface of the first portion extends into the first portion further than a side surface of the second portion, and a side surface of the third portion extends into the third portion further than the side surface of the second portion.

According to an exemplary embodiment of the present disclosure, a nonvolatile memory device includes a mold structure including a first insulating pattern, a gate electrode, and a second insulating pattern sequentially stacked on a substrate, a semiconductor pattern penetrating through the mold structure and contacting the substrate, a first charge storage film, and a second charge storage film separated from the first charge storage film. The first charge storage film and the second charge storage film are disposed between the gate electrode and the semiconductor pattern. The gate electrode includes a first recess that extends into the gate electrode further than a side surface of the first insulating pattern, and a second recess that extends into the gate electrode further than a side surface of the second insulating pattern. The first charge storage film fills at least a portion of the first recess, and the second charge storage film fills at least a portion of the second recess.

According to an exemplary embodiment of the present disclosure, a method for fabricating a nonvolatile memory device includes forming a plurality of insulating films and a plurality of sacrificial films which are alternately stacked on a substrate. Each of the sacrificial films includes first to third sacrificial films which are sequentially stacked on one another. The method further includes forming a channel hole exposing the substrate by penetrating through the plurality of insulating films and the plurality of sacrificial films, forming a first recess within the first sacrificial film and a second recess within the third sacrificial film by performing a recess formation process having etch selectivity with respect to the first and third sacrificial films exposed by the channel hole, forming a first charge storage film filling at least a portion of the first recess and a second charge storage film filling at least a portion of the second recess, and forming a semiconductor pattern filling at least a portion of the channel hole and contacting the substrate on the first and second charge storage films.

BRIEF DESCRIPTION OF THE DRAWINGS

The above and other aspects and features of the present disclosure will become more apparent by describing in detail exemplary embodiments thereof with reference to the accompanying drawings, in which.

DETAILED DESCRIPTION

Figure 1:
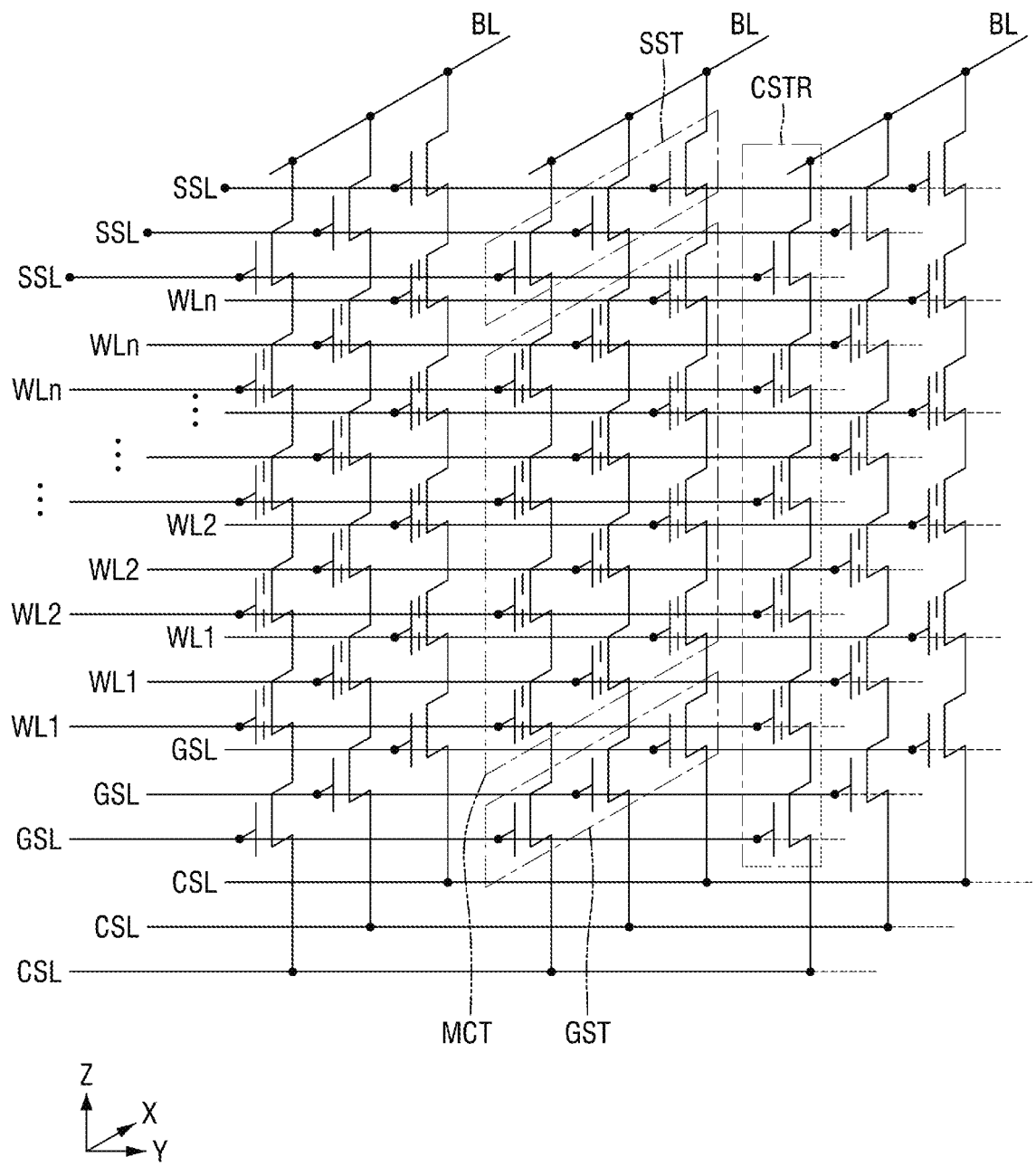
FIG. 1 is a schematic circuit view provided to describe a nonvolatile memory device according to exemplary embodiments of the present disclosure.

Exemplary embodiments of the present disclosure will be described more fully hereinafter with reference to the accompanying drawings. Like reference numerals may refer to like elements throughout the accompanying drawings.

It should be understood that the terms "first," "second," "third," etc. are used herein to distinguish one element from another, and the elements are not limited by these terms. Thus, a "first" element in an exemplary embodiment may be described as a "second" element in another exemplary embodiment.

It should be further understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It should be further understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words use to describe the relationship between elements should be interpreted in a like fashion.

Herein, when one value is described as being substantially the same as or equal to another value, it is to be understood that the values are equal to each other within a measurement error, or if measurably unequal, are close enough in value to be functionally equal to each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Other uses of the word "substantially" should be construed in a like fashion.

Hereinbelow, a nonvolatile memory device according to exemplary embodiments of the present disclosure will be described with reference to FIGS. 1 to 9.

FIG. 1 is a schematic circuit view provided to describe a nonvolatile memory device according to exemplary embodiments of the present disclosure.

Referring to FIG. 1, a nonvolatile memory device according to exemplary embodiments may include a common source line (CSL), a plurality of bit lines (BL), and a plurality of cell strings (CSTR).

A plurality of bit lines (BL) may be arranged in a two-dimensional matrix. For example, each of the bit lines (BL) may be separated from one another and extend in a first direction X. Each of the bit lines (BL) may be connected with a plurality of cell strings (CSTR) in parallel. The cell strings (CSTR) may be commonly connected with the common source line (CSL). For example, a plurality of cell strings (CSTR) may be disposed between a plurality of bit lines (BL) and the common source line (CSL).

According to exemplary embodiments, a plurality of common source lines (CSL) may be arranged in a two-dimensional matrix. For example, each of the common source lines (CSL) may be separated from one another and extend in a second direction Y. The common source lines (CSL) may be applied with a same voltage electrically, or alternatively, may be controlled separately in application of different voltages from one another.

Each of the cell strings (CSTR) may include a ground select transistor (GST) in contact with the common source line (CSL), a string select transistor (SST) in contact with the bit line (BL), and a plurality of memory cell transistors (MCT) disposed between the ground select transistor (GST) and the string select transistor (SST). Each of the memory cell transistors (MCT) may include a data storage element. The ground select transistor (GST), the string select transistor (SST), and the memory cell transistor (MCT) may be connected with one another, for example, in series.

The common source line (CSL) may be commonly connected with a source of the ground select transistor (GST). Further, the ground select line (GSL), a plurality of word lines WL1-WLn and a string select line (SSL) may be disposed between the common source line (CSL) and the bit line (BL). The ground select line (GSL) may be used as a gate electrode of the ground select transistor (GST), a plurality of word lines WL1-WLn may be used as a gate electrode of the memory cell transistors (MCT), and the string select line (SSL) may be used as a gate electrode of the string select transistor (SST).

Figure 2:
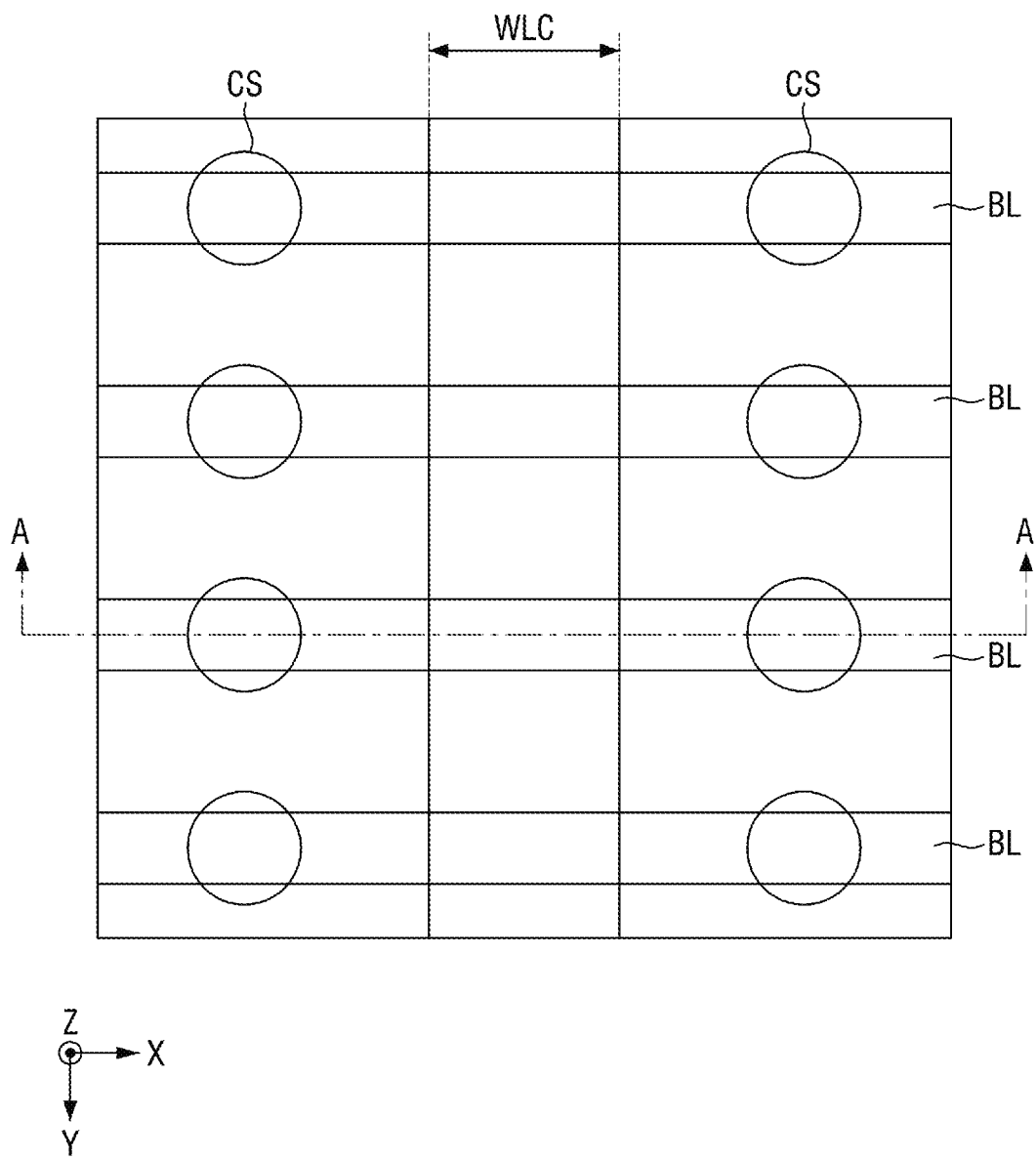
FIG. 2 is a schematic layout view provided to describe a nonvolatile memory device according to exemplary embodiments of the present disclosure.
Figure 3:
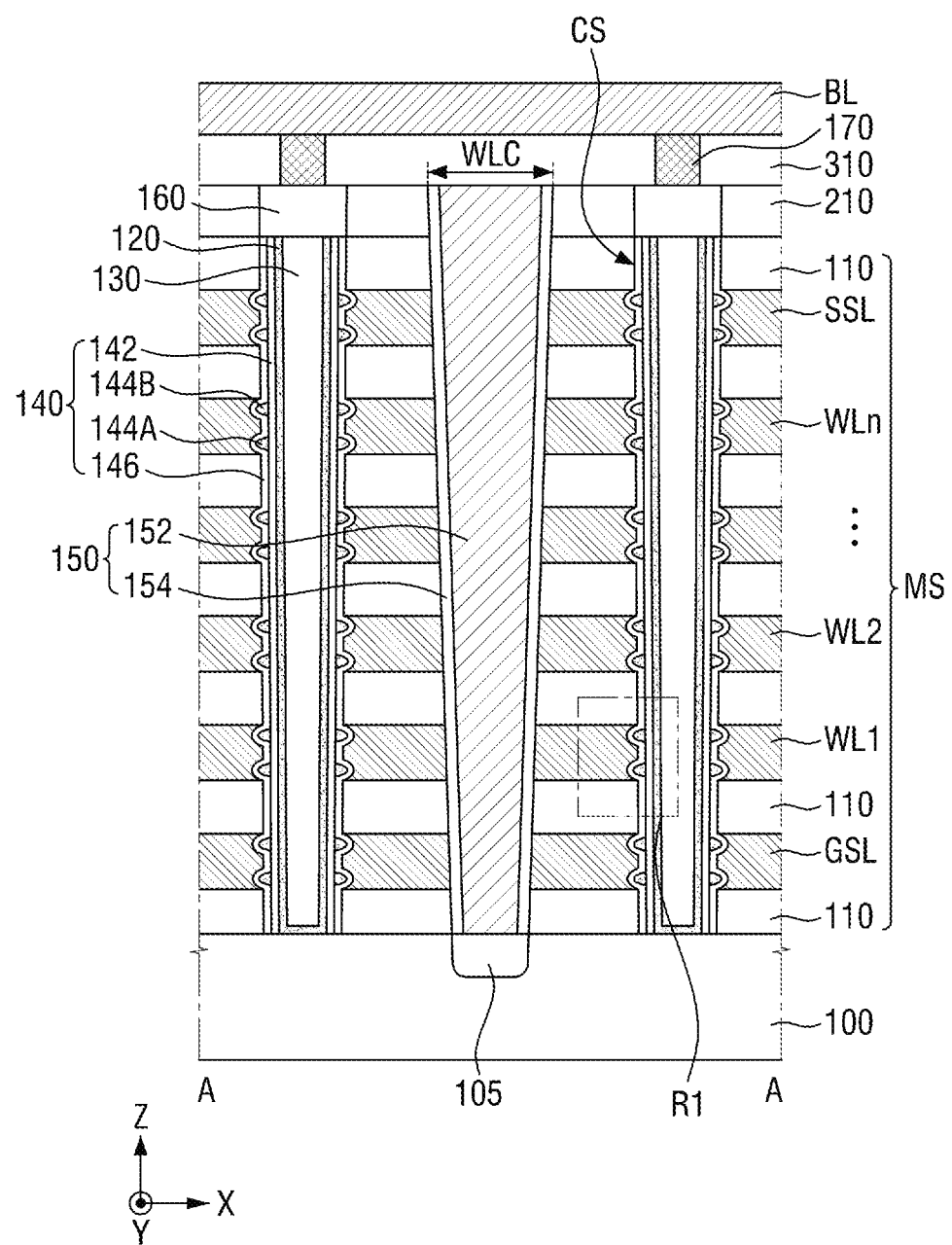
FIG. 3 is a cross-sectional view taken along line A-A of FIG. 2.

FIG. 2 is a schematic layout view provided to describe a nonvolatile memory device according to exemplary embodiments of the present disclosure. FIG. 3 is a cross-sectional view taken along line A-A of FIG. 2.

Referring to FIGS. 2 and 3, the nonvolatile memory device according to exemplary embodiments includes a substrate 100, a mold structure (MS), a plurality of channel structures (CS) and a plurality of bit lines (BL).

The substrate 100 may include, for example, a semiconductor substrate such as a silicon substrate, a germanium substrate, a silicon-germanium substrate, etc. Alternatively, the substrate 100 may include a silicon-on-insulator (SOI) substrate, germanium-on-insulator (GOI) substrate, etc.

The mold structure (MS) may be formed on the substrate 100. The mold structure (MS) may include a plurality of gate electrodes (GSL, WL1, WL2~WLn, SSL) and a plurality of insulating patterns 110 which are stacked on the substrate 100. For example, each of the gate electrodes (GSL, WL1, WL2~WLn, SSL) and each of the insulating patterns 110 may be a stratified structure extending in the first direction X and the second direction Y.

Each of the gate electrodes (GSL, WL1, WL2~WLn, SSL) may be alternately stacked with each of the insulating patterns 110. For example, a plurality of gate electrodes (GSL, WL1, WL2~WLn, SSL) may be separated from one another along a third direction Z and stacked sequentially. Herein, each of the insulating patterns 110 may be interposed between a plurality of gate electrodes (GSL, WL1, WL2~WLn, SSL). For example, a plurality of gate electrodes (GSL, WL1, WL2~WLn, SSL) may be separated from one another electrically by each of the insulating patterns 110.

Although FIG. 3 illustrates that a plurality of gate electrodes (GSL, WL1, WL2~WLn, SSL) have a same thickness, exemplary embodiments are not limited thereto. For example, in exemplary embodiments, some or all of the plurality of gate electrodes (GSL, WL1, WL2~WLn, SSL) may have different thicknesses from one another.

According to exemplary embodiments, a plurality of gate electrodes (GSL, WL1, WL2~WLn, SSL) may include the ground select line (GSL), a plurality of word lines (WL1, WL2~WLn), and the string select line (SSL). The ground select line (GSL), a plurality of word lines (WL1, WL2~WLn), and the string select line (SSL) may be sequentially stacked on the substrate 100.

Although FIG. 3 illustrates only four word lines disposed between the ground select line (GSL) and the string select line (SSL), exemplary embodiments are not limited thereto. For example, in exemplary embodiments, 8, 16, 32, 64, or more word lines may be stacked between the ground select line (GSL) and the string select line (SSL).

Each of the gate electrodes (GSL, WL1, WL2~WLn, SSL) may include a conductive material. For example, each of the gate electrodes (GSL, WL1, WL2~WLn, SSL) may include a metal such as tungsten (W), cobalt (Co), or nickel (Ni), or a semiconductor material such as silicon. However, exemplary embodiments are not limited thereto.

Each of the insulating patterns 110 may include an insulating material. For example, each of the insulating patterns 110 may include silicon oxide. However, exemplary embodiments are not limited thereto.

According to exemplary embodiments, the mold structure (MS) may be isolated by a word line cut region (WLC). For example, the word line cut region (WLC) may extend in the second direction Y and cut the mold structure (MS).

According to exemplary embodiments, an isolation structure 150 may be formed within the word line cut region (WLC). As illustrated in FIG. 3, the isolation structure 150 may extend to the substrate 100, and may contact the substrate 100, by penetrating through the mold structure (MS). Accordingly, the isolation structure 150 may extend in the second direction Y and cut the mold structure (MS). According to exemplary embodiments, the isolation structure 150 may include a plug pattern 152 and a spacer 154.

The plug pattern 152 may be in contact with the substrate 100 by penetrating through the mold structure (MS). For example, the plug pattern 152 may penetrate through the mold structure (MS) and may directly contact the substrate 100. According to exemplary embodiments, the plug pattern 152 may be provided as a common source line (e.g., CSL of FIG. 1) of the nonvolatile memory device. For example, the plug pattern 152 may include a conductive material. Further, the plug pattern 152 may be in contact with an impurity region 105 within the substrate 100. For example, the plug pattern 152 may penetrate through the mold structure (MS) and may directly contact the impurity region 105 disposed within the substrate 100. The impurity region 105 may extend, for example, in the second direction Y.

The spacer 154 may be interposed between the plug pattern 152 and the mold structure (MS). For example, the spacer 154 may extend along a side surface of the plug pattern 152. In an exemplary embodiment, the spacer 153 extends along the entirety of the side surface of the plug pattern 152. The spacer 154 may include an insulating material. For example, the spacer 154 may electrically displace (e.g., separate) the plug pattern 152 from a plurality of gate electrodes (GSL, WL1, WL2~WLn, SSL) of the mold structure (MS).

A plurality of channel structures (CS) may be in contact (e.g., direct contact) with the substrate 100 by penetrating through the mold structure (MS). Further, a plurality of channel structures (CS) may extend in a direction that intersects with a plurality of gate electrodes (GSL, WL1, WL2~WLn, SSL). For example, each of the channel structures (CS) may be a pillar shape extending in the third direction Z. Each of the channel structures (CS) may include a semiconductor pattern 120 and an information storage film 140.

The semiconductor pattern 120 may be in contact (e.g., direct contact) with the substrate 100 by penetrating through the mold structure (MS). For example, the semiconductor pattern 120 may be in contact (e.g., direct contact) with the substrate 100 as extending in the third direction Z. The semiconductor pattern 120 may extend in the third direction Z which intersects the upper surface of the substrate 100. For example, the semiconductor pattern 120 may extend substantially perpendicular to the upper surface of the substrate 100. Although FIG. 3 illustrates that the semiconductor pattern 120 is cup-shaped, exemplary embodiments are not limited thereto. For example, in exemplary embodiments, the semiconductor pattern 120 may have various shapes such as a cylinder shape, a square container shape, a pillar shape having a full inner portion, etc.

The semiconductor pattern 120 may include a semiconductor material such as, for example, monocrystal silicon, polycrystal silicon, organic semiconductor material, carbon nano structure, etc. However, exemplary embodiments are not limited thereto.

The information storage film 140 may be interposed between the semiconductor pattern 120 and a plurality of gate electrodes (GSL, WL1, WL2~WLn, SSL). For example, the information storage film 140 may extend along a side surface of the semiconductor pattern 120. In an exemplary embodiment, the information storage film 140 may extend along an entirety of the side surface of the semiconductor pattern 120.

The information storage film 140 may include, for example, at least one of silicon oxide, silicon nitride, silicon oxynitride, and a high-k dielectric material with a higher dielectric constant than silicon oxide. The high-k dielectric material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and a combination thereof.

According to exemplary embodiments, the information storage film 140 may include a plurality of films. For example, the information storage film 140 may include a tunnel insulating film 142, a charge storage film 144A, 144B and a blocking insulating film 146, which are stacked sequentially on the semiconductor pattern 120. The tunnel insulating film 142 may include, for example, silicon oxide, or a high-k dielectric material with a higher dielectric constant than silicon oxide (e.g., $Al_2O_3$ and $HfO_2$). The charge storage film 144A, 144B may include, for example, a silicon nitride. The blocking insulating film 146 may include, for example, silicon oxide, or a high-k dielectric material with a higher dielectric constant than silicon oxide (e.g., $Al_2O_3$ and $HfO_2$).

The information storage film 140 may include two charge storage films which are separated from each other (e.g., a first charge storage film 144A and a second charge storage film 144B) in each of the gate electrodes (GSL, WL1, WL2~WLn, SSL). For example, the first charge storage film 144A and the second charge storage film 144B may be spatially and electrically separated from each other in the third direction Z by the blocking insulating film 146 disposed between the first charge storage film 144A and the second charge storage film 144B. The first charge storage film 144A and the second charge storage film 144B may be disposed between each of the gate electrodes (GSL, WL1, WL2~WLn, SSL) and the semiconductor pattern 120. For example, each of the gate electrodes (GSL, WL1, WL2~WLn, SSL) may have a corresponding portion of the first charge storage film 144A and the second charge storage film 144B disposed between it and the semiconductor pattern 120. Further, the two charge storage films (the first charge storage film 144A and the second charge storage film 144B) may be formed in a buried form in each of the gate electrodes (GSL, WL1, WL2~WLn, SSL). The first charge storage film 144A and the second charge storage film 144B will be described in more detail below with reference to FIG. 4.

According to exemplary embodiments, each of the channel structures (CS) may further include a filling insulating pattern 130. The filling insulating pattern 130 may be formed to fill an inner portion of the semiconductor pattern 120 which is cup-shaped. For example, the semiconductor pattern 120 may extend conformally along a side surface and a bottom surface of the filling insulating pattern 130. The filling insulating pattern 130 may include, for example, silicon oxide. However, exemplary embodiments are not limited thereto.

According to exemplary embodiments, each of the channel structures (CS) may further include a channel pad 160. The channel pad 160 may be formed to be in contact (e.g., direct contact) with an upper portion of the semiconductor pattern 120. For example, the channel pad 160 may be formed within a first interlayer insulating film 210 formed on the mold structure (MS).

Although FIG. 3 illustrates that the channel pad 160 may be formed on an upper surface of the semiconductor pattern 120, exemplary embodiments are not limited thereto. For example, in an exemplary embodiment, an upper portion of the semiconductor pattern 120 may be formed to extend along a side surface of the channel pad 160. The channel pad 160 may include, for example, poly silicon doped with impurities. However, exemplary embodiments are not limited thereto.

A plurality of bit lines (BL) may be in contact (e.g., direct contact) with a plurality of channel structures (CS). For example, each of the bit lines (BL) may be in contact (e.g., direct contact) with each of the channel structures (CS) through a bit line contact 170. For example, the bit line contact 170 may electrically connect the channel structure (CS) and the bit line (BL) by penetrating through a second interlayer insulating film 310 on the mold structure (MS).

According to exemplary embodiments, a plurality of bit lines (BL) may extend substantially in parallel along a direction intersecting with the word line cut region (WLC). For example, each of the bit lines (BL) may extend in the first direction X.

Figure 4:
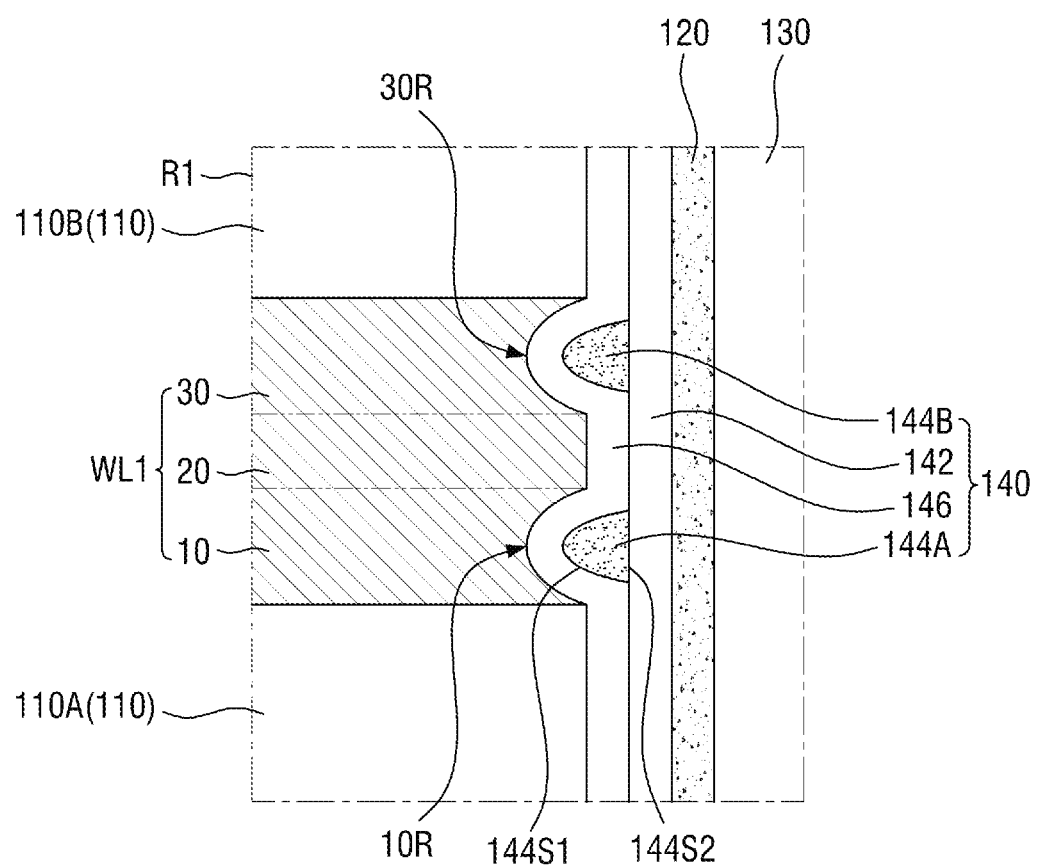
FIG. 4 is an enlarged view of region R1 of FIG. 3 according to exemplary embodiments of the present disclosure.

FIG. 4 is an enlarged view of region R1 of FIG. 3 according to exemplary embodiments of the present disclosure. For reference, although FIG. 4 illustrates only one word line (e.g., a first word line WL1) among a plurality of gate electrodes (GSL, WL1, WL2~WLn, SSL), the first charge storage film 144A and the second charge storage film 144B may be formed similarly with respect to the other gate electrodes (GSL, WL2~WLn, SSL).

Referring to FIG. 4, each of the gate electrodes (GSL, WL1, WL2~WLn, SSL) may include first to third portions 10, 20, 30 which are stacked sequentially on the substrate 100.

According to exemplary embodiments, a side surface of the first portion 10 and a side surface of the third portion 30 may extend into the first portion 10 and the third portion 30, respectively, further than a side surface of the second portion 20. For example, the first portion 10 may include a first recess 10R that extends into the first portion 10 further than a side surface of the second portion 20, and the third portion 30 may include a second recess 30R that extends into the third portion 30 further than a side surface of the second portion 20. For example, the first recess 10R may be recessed inward from a side surface of the first portion 10, and the second recess 30R may be recessed inward from a side surface of the third portion 30. Since the second portion 20 may be interposed between the first portion 10 and the third portion 30, the first recess 10R and the second recess 30R may be separated from each other with the second portion 20 is placed therebetween. In an exemplary embodiment, the side surface of the second portion 20 may be substantially flat, and the side surfaces of the first portion 10 and the third portion 30 may be concave into the first portion 10 and the third portion 30, respectively.

The first charge storage film 144A may be interposed between the first portion 10 and the semiconductor pattern 120, and the second charge storage film 144B may be interposed between the third portion 30 and the semiconductor pattern 120. The first charge storage film 144A may fill at least a portion of the first recess 10R, and the second charge storage film 144B may fill at least a portion of the second recess 30R. Accordingly, the two charge storage films corresponding to the first word line WL1 (e.g., first charge storage film 144A and second charge storage film 144B) may be formed in a buried form within the first word line WL1.

Although the first charge storage film 144A and the second charge storage film 144B are illustrated as being the same size as each other in FIG. 4, exemplary embodiments are not limited thereto. For example, in an exemplary embodiment, the first charge storage film 144A and the second charge storage film 144B may be formed to be different sizes from each other. For example, one of the first charge storage film 144A extending into the first portion 10 and the second charge storage film 144B extending into the third portion 30 may extend further into its respective portion than the other charge storage film, and/or a length of the surface of one of the first charge storage film 144A and the second charge storage film 144B contacting the tunnel insulating film 142 and extending in the third direction Z may be larger than the length of the surface of the other charge storage film contacting the tunnel insulating film 142 and extending in the third direction Z.

Since each of the gate electrodes (GSL, WL1, WL2~WLn, SSL) may be alternately stacked with each of the insulating patterns 110, the first word line WL1 may be interposed between insulating patterns 110. For example, the first word line WL1 may be interposed between a first insulating pattern 110A and a second insulating pattern 110B. The first insulating pattern 110A, the first word line WL1 and the second insulating pattern 110B may be sequentially stacked on the substrate 100.

According to exemplary embodiments, the first charge storage film 144A and the second charge storage film 144B may be adjacent to the insulating patterns 110. For example, the first recess 10R may be adjacent to the first insulating pattern 110A, and the second recess 30R may be adjacent to the second insulating pattern 110B. Accordingly, the first charge storage film 144A may be adjacent to the first insulating pattern 110A, and the second charge storage film 144B may be adjacent to the second insulating pattern 110B.

According to exemplary embodiments, the first recess 10R may extend further into the first portion 10 than a side surface of the first insulating pattern 110A. Further, according to exemplary embodiments, the second recess 30R may extend further into the third portion 30 than a side surface of the second insulating pattern 110B.

According to exemplary embodiments, a blocking insulating film 146 may be interposed between the first charge storage film 144A and each of the gate electrodes (GSL, WL1, WL2~WLn, SSL) and between the second charge storage film 144B and each of the gate electrodes (GSL, WL1, WL2~WLn, SSL). For example, the blocking insulating film 146 may extend along a profile of the first recess 10R and the second recess 30R. The first charge storage film 144A may be disposed on the blocking insulating film 146 extending along a profile of the first recess 10R, and the second charge storage film 144B may be disposed on the blocking insulating film 146 extending along a profile of the second recess 30R.

According to exemplary embodiments, the blocking insulating film 146 may extend continuously along a side surface of a plurality of gate electrodes (GSL, WL1, WL2~WLn, SSL) and a side surface of a plurality of insulating patterns 110. For example, as illustrated in FIG. 4, the blocking insulating film 146 may continuously extend along a profile with respect to a side surface of the first insulating pattern 110A, a side surface of the first word line WL1, and a side surface of the second insulating pattern 110B.

According to exemplary embodiments, the blocking insulating film 146 may continuously extend along a profile with respect to a side surface of the first portion 10 (e.g., the first recess 10R), a side surface of the second portion 20 and a side surface of the third portion 30 (e.g., the second recess 30R). Further, the first charge storage film 144A may be formed only on the blocking insulating film 146 which extends along a profile of the first recess 10R, and the second charge storage film 144B may be formed only on the blocking insulating film 146 which extends along a profile of the second recess 30R. Accordingly, the first charge storage film 144A and the second charge storage film 144B may be separated electrically from each other in the third direction Z by the blocking insulating film 146.

According to exemplary embodiments, the tunnel insulating film 142 may be interposed between the first charge storage film 144A and the semiconductor pattern 120 and between the second charge storage film 144B and the semiconductor pattern 120. For example, the tunnel insulating film 142 may extend along a side surface of the first charge storage film 144A, a second side surface of the second charge storage film 144B, and a side surface of the blocking insulating film 146. According to exemplary embodiments, the tunnel insulating film 142 may extend along a profile with respect to the blocking insulating film 146 on the first insulating pattern 110A, the first charge storage film 144A, the blocking insulating film 146 on the second portion 20, the second charge storage film 144B, and the blocking insulating film 146 on the second insulating pattern 110B.

According to exemplary embodiments, a side surface of the first portion 10 and/or a side surface of the third portion 30 may have a concave shape. For example, the first recess 10R and/or the second recess 30R may be formed to be concave in a direction away from the semiconductor pattern 120. For example, the first recess 10R, which faces the semiconductor pattern 120, may be concave into (e.g., recessed into) the first portion 10, and the second recess 30R may be concave into (e.g., recessed into) the third portion 30. In this specification, "and/or" includes each of the mentioned items and one or more of combinations. For example, although FIG. 4 illustrates that the first recess 10R and the second recess 30R both have a concave shape, exemplary embodiments are not limited thereto. For example, in an exemplary embodiment, only one among the first recess 10R and the second recess 30R may be formed to have a concave shape.

According to exemplary embodiments, a side surface of the first charge storage film 144A and/or a side surface of the second charge storage film 144B which oppose each of the gate electrodes (GSL, WL1, WL2~WLn, SSL) may have a convex shape. For example, the blocking insulating film 146 may extend along a profile of the first recess 10R, and the first charge storage film 144A may be formed on the blocking insulating film 146 to fill the first recess 10R. Accordingly, as illustrated in FIG. 4, the first charge storage film 144A may include a first surface 144S1 which has a convex shape toward the first word line WL1. For example, the first surface 144S1 of the first charge storage film 144A may be convex into the first recess 10R.

According to exemplary embodiments, a side surface of the first charge storage film 144A opposing the semiconductor pattern 120 and/or a side surface of the second charge storage film 144B may have a shape that is substantially parallel with a side surface of the semiconductor pattern 120. For example, the first charge storage film 144A may completely fill a trench within the first recess 10R formed by the blocking insulating film 146. Accordingly, as illustrated in FIG. 4, the first charge storage film 144A may include a second surface 144S2 that is substantially parallel with a side surface of the semiconductor pattern 120. For example, the second surface 144S2 of the first charge storage film 144A and the side surface of the semiconductor pattern 120 may both extend in the third direction Z.

Figure 5A:
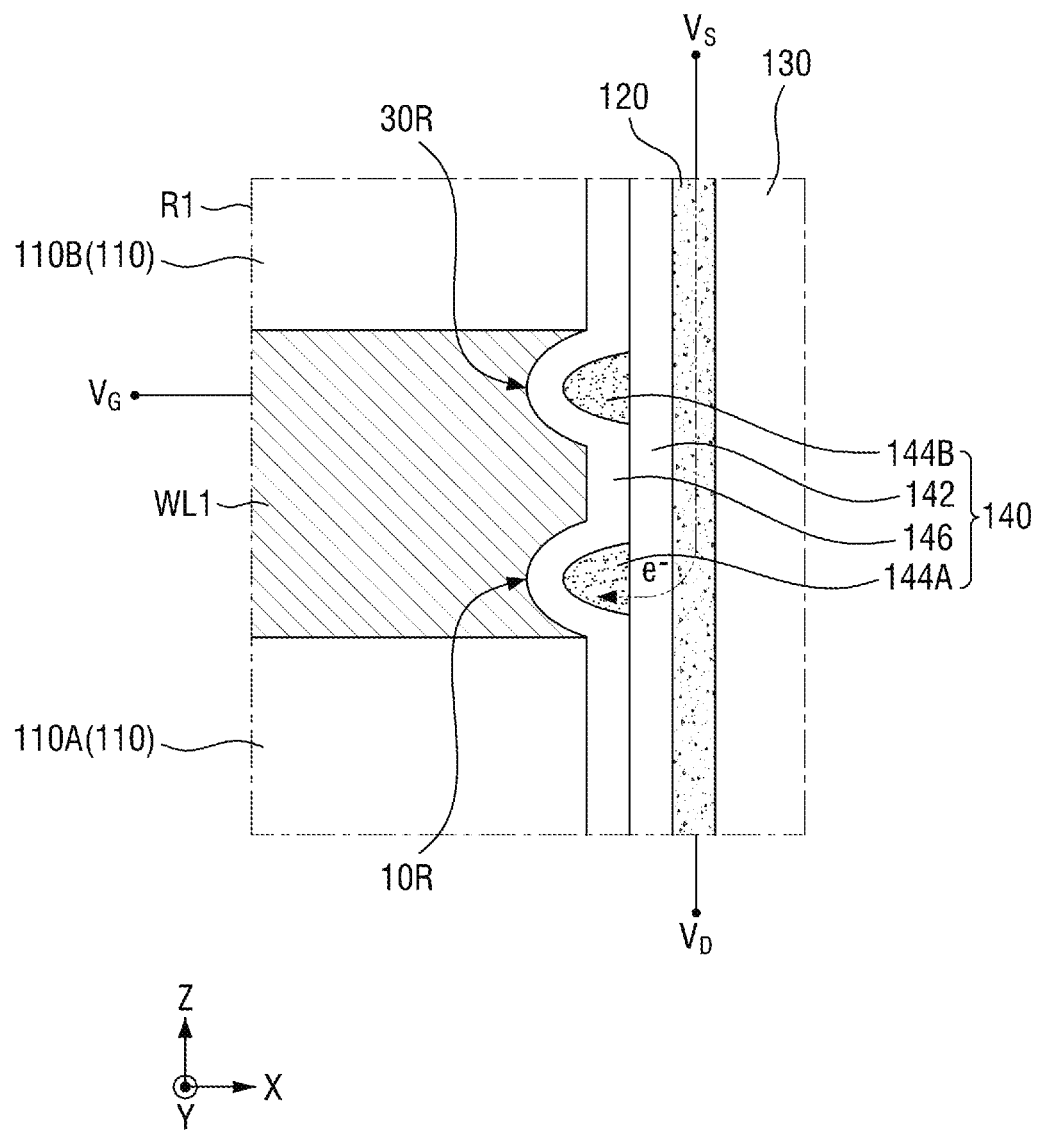
FIGS. 5A and 5B are views provided to describe an exemplary operation of a nonvolatile memory device according to exemplary embodiments of the present disclosure.
Figure 5B:
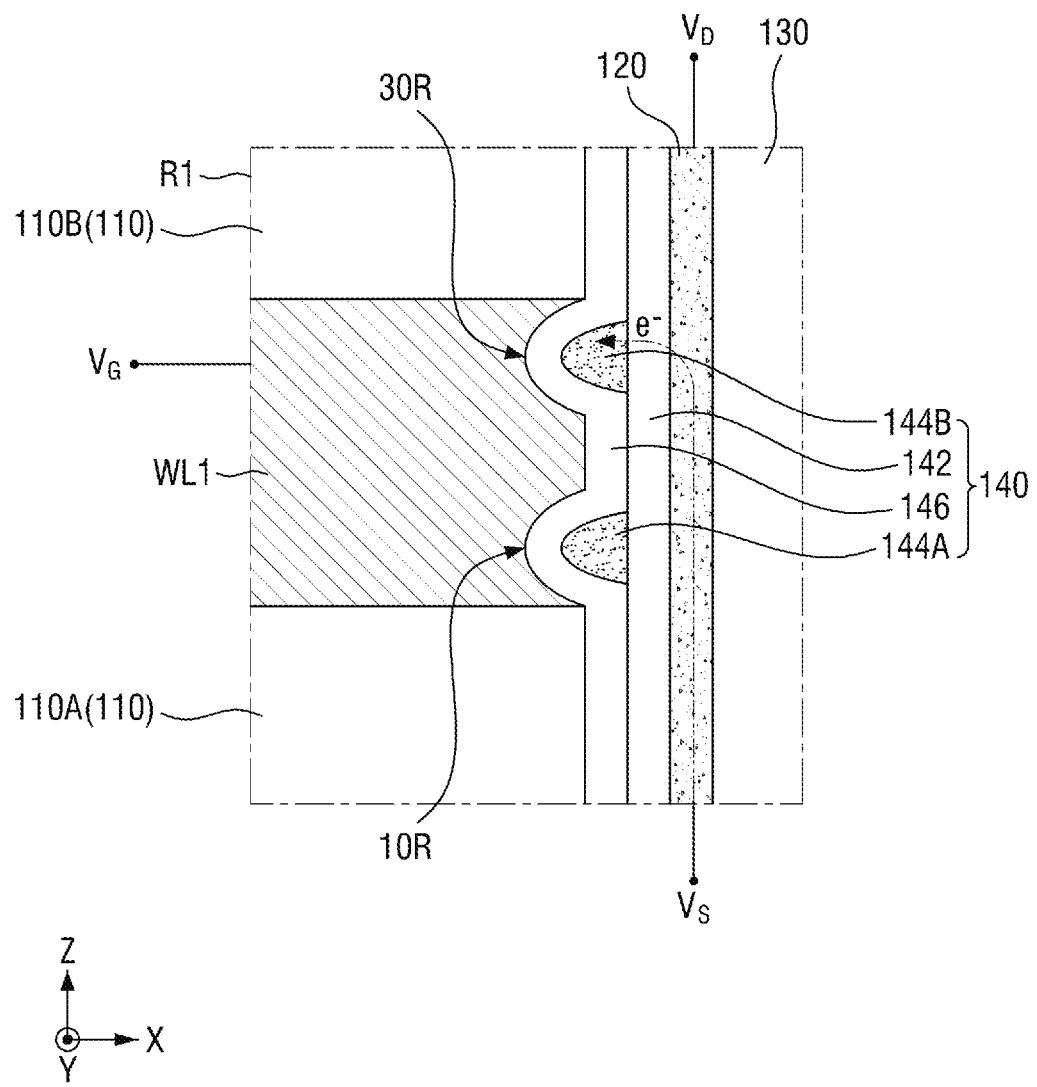

FIGS. 5A and 5B are views provided to describe an exemplary operation of a nonvolatile memory device according to exemplary embodiments of the present disclosure.

As described above, a nonvolatile memory device according to exemplary embodiments may include the first charge storage film 144A and the second charge storage film 144B, which are separated from each other in each of the word lines (WL1, WL2~WLn). The first charge storage film 144A and the second charge storage film 144B may store a charge independently of each other.

For example, referring to FIG. 5A, a gate voltage $V_G$ may be applied to the first word line WL1. The gate voltage $V_G$ may be, for example, a positive voltage. Further, a first voltage $V_S$ may be applied to an upper portion of the semiconductor pattern 120, and a second voltage $V_D$ different from the first voltage $V_S$ may be applied to a lower portion of the semiconductor pattern 120. For example, the first voltage $V_S$ may be a ground voltage, and the second voltage $V_D$ may be a positive voltage. In this case, a charge (electron) provided from an upper portion of the semiconductor pattern 120 may be selectively trapped in the first charge storage film 144A.

Further, for example, referring to FIG. 5B, the gate voltage $V_G$ may be applied to the first word line WL1. The gate voltage $V_G$ may be, for example, a positive voltage. Further, the first voltage $V_S$ may be applied to a lower portion of the semiconductor pattern 120, and the second voltage $V_D$ different from the first voltage $V_S$ may be applied to an upper portion of the semiconductor pattern 120. For example, the first voltage $V_S$ may be a ground voltage, and the second voltage $V_D$ may be a positive voltage. In this case, the charge (electron) provided from a lower portion of the semiconductor pattern 120 may be selectively trapped in the second charge storage film 144B.

Accordingly, the nonvolatile memory device according to exemplary embodiments may implement two data storage elements per each of word lines (WL1, WL2~WLn). Accordingly, a nonvolatile memory device having improved integration density may be provided.

FIGS. 6A to 6D are enlarged views of region R1 of FIG. 3 according to exemplary embodiments of the present disclosure. For convenience of explanation, a further description of elements and aspects previously described with reference to FIGS. 1 to 5B may be omitted or only briefly described.

Figure 6A:
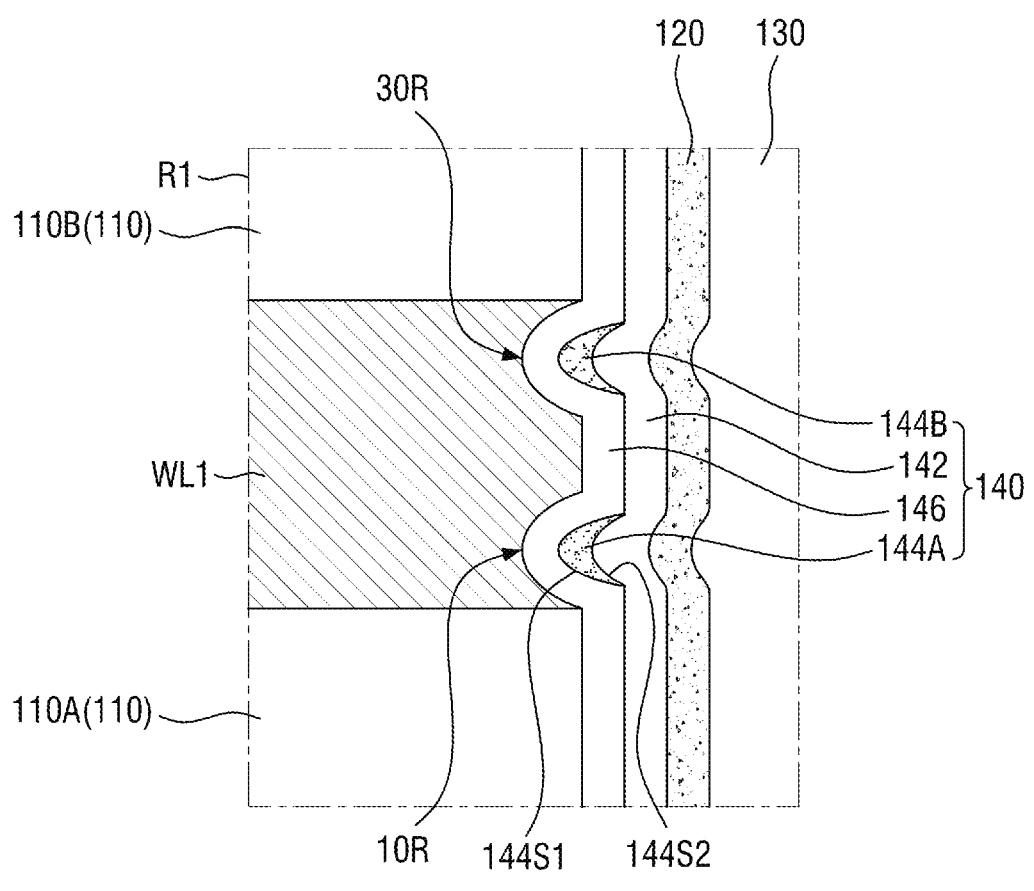
FIGS. 6A to 6D are enlarged views of region R1 of FIG. 3 according to exemplary embodiments of the present disclosure.

Referring to FIG. 6A, in a nonvolatile memory device according to exemplary embodiments, a side surface of the first charge storage film 144A and/or a side surface of the second charge storage film 144B, which oppose the semiconductor pattern 120, may have a concave shape.

For example, the second surface 144S2 of the first charge storage film 144A may be a concave shape with respect to the semiconductor pattern 120. For example, the second surface 144S2 of the first charge storage film 144A, which faces the semiconductor pattern 120, may be concave in a direction away from the semiconductor pattern 120. According to exemplary embodiments, the first charge storage film 144A does not completely fill a trench within the first recess 10R formed by the blocking insulating film 146. For example, the second surface 144S2 of the first charge storage film 144A may extend further away from the semiconductor pattern 120 than a side surface of the blocking insulating film 146 which opposes the semiconductor pattern 120.

According to exemplary embodiments, the tunnel insulating film 142 may extend along a profile with respect to the first charge storage film 144A, the second charge storage film 144B, and the blocking insulating film 146. In this case, a portion of the tunnel insulating film 142 may have a curved shape along a profile of the first charge storage film 144A and the second charge storage film 144B.

According to exemplary embodiments, the semiconductor pattern 120 may extend along a profile of the tunnel insulating film 142. In this case, a portion of the semiconductor pattern 120 may have a curved shape along a profile of the tunnel insulating film 142.

Figure 6B:
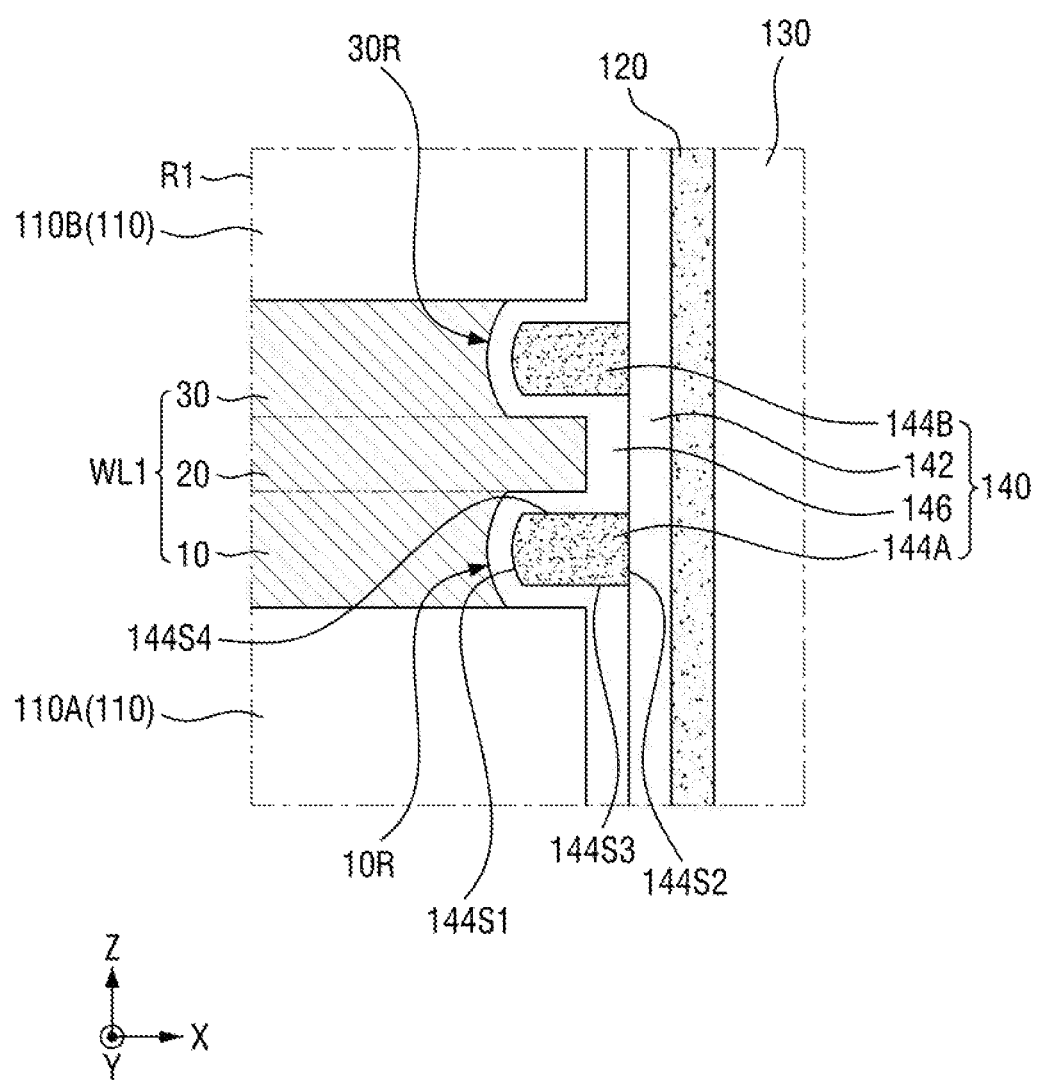

Referring to FIG. 6B, in a nonvolatile memory device according to exemplary embodiments, the first recess 10R and/or the second recess 30R may expose a portion of the insulating patterns 110.

For example, the first recess 10R may expose a portion of an upper surface of the first insulating pattern 110A. Since the blocking insulating film 146 may extend along a profile of the first word line WL1, the first charge storage film 144A may further include a third surface 144S3 opposing an upper surface of the first insulating pattern 110A.

According to exemplary embodiments, the first recess 10R may expose a portion of a bottom surface of the second portion 20. Since the blocking insulating film 146 may extend along a profile of the first word line WL1, the first charge storage film 144A may further include a fourth surface 144S4 opposing a bottom surface of the second portion 20.

Similar to the first recess 10R, the second recess 30R may expose a portion of a bottom surface of the second insulating pattern 110B. According to exemplary embodiments, the second recess 30R may expose a portion of an upper surface of the second portion 20.

Figure 6C:
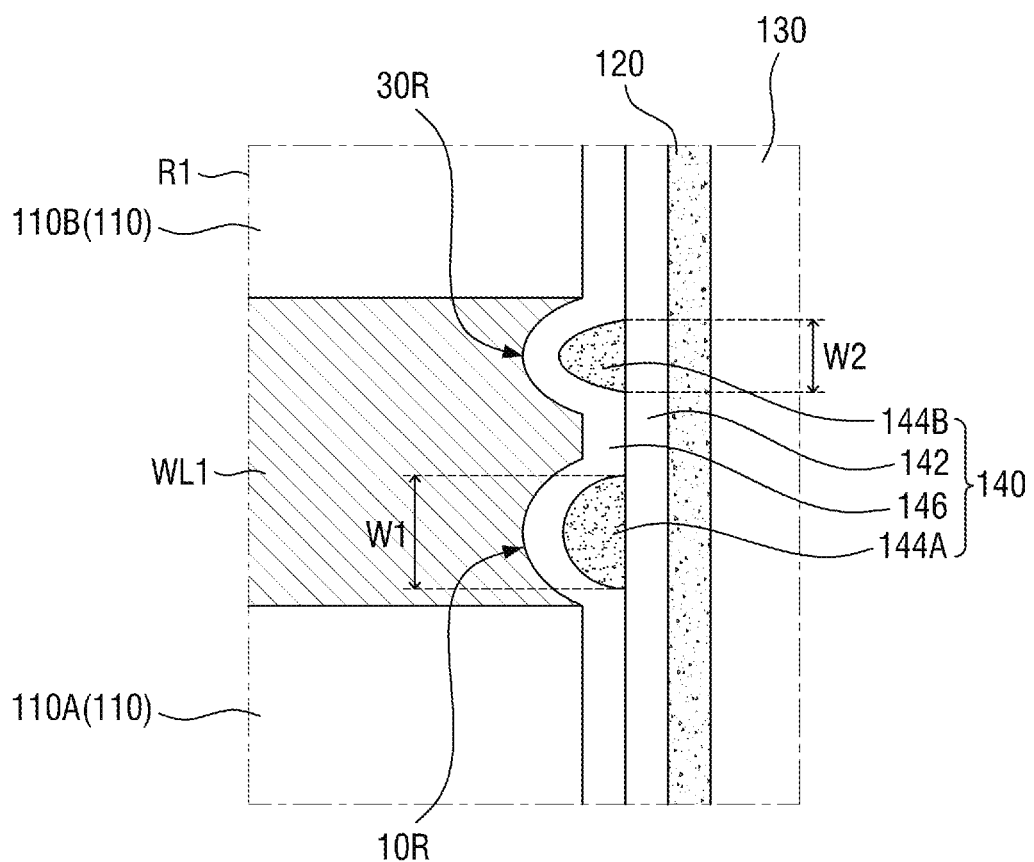

Referring to FIG. 6C, in a nonvolatile memory device according to exemplary embodiments, the first charge storage film 144A and the second charge storage film 144B may have different widths from each other.

A "width" expressed herein indicates a width in a direction that intersects an upper surface of the substrate 100. For example, in the third direction Z, which is substantially perpendicular to the upper surface of the substrate 100, a first width W1 of the first charge storage film 144A may be different from a second width W2 of the second charge storage film 144B.

Although FIG. 6C only illustrates that the first width W1 of the first charge storage film 144A is greater than the second width W2 of the second charge storage film 144B, exemplary embodiments are not limited thereto. For example, in exemplary embodiments, the first width W1 of the first charge storage film 144A may be less than the second width W2 of the second charge storage film 144B.

According to exemplary embodiments, the first width W1 of the first charge storage film 144A and the second width W2 of the second charge storage film 144B may become different according to the position of each of the word lines (WL1, WL2~WLn). For example, the first width W1 may be greater than the second width W2 with respect to the first word line WL1 disposed on a lower portion among a plurality of word lines (WL1, WL2~WLn). Differently from the above, the first width W1 may be less than the second width W2 with respect to an nth word line WLn disposed on an upper portion among a plurality of word lines (WL1, WL2~WLn).

Figure 6D:
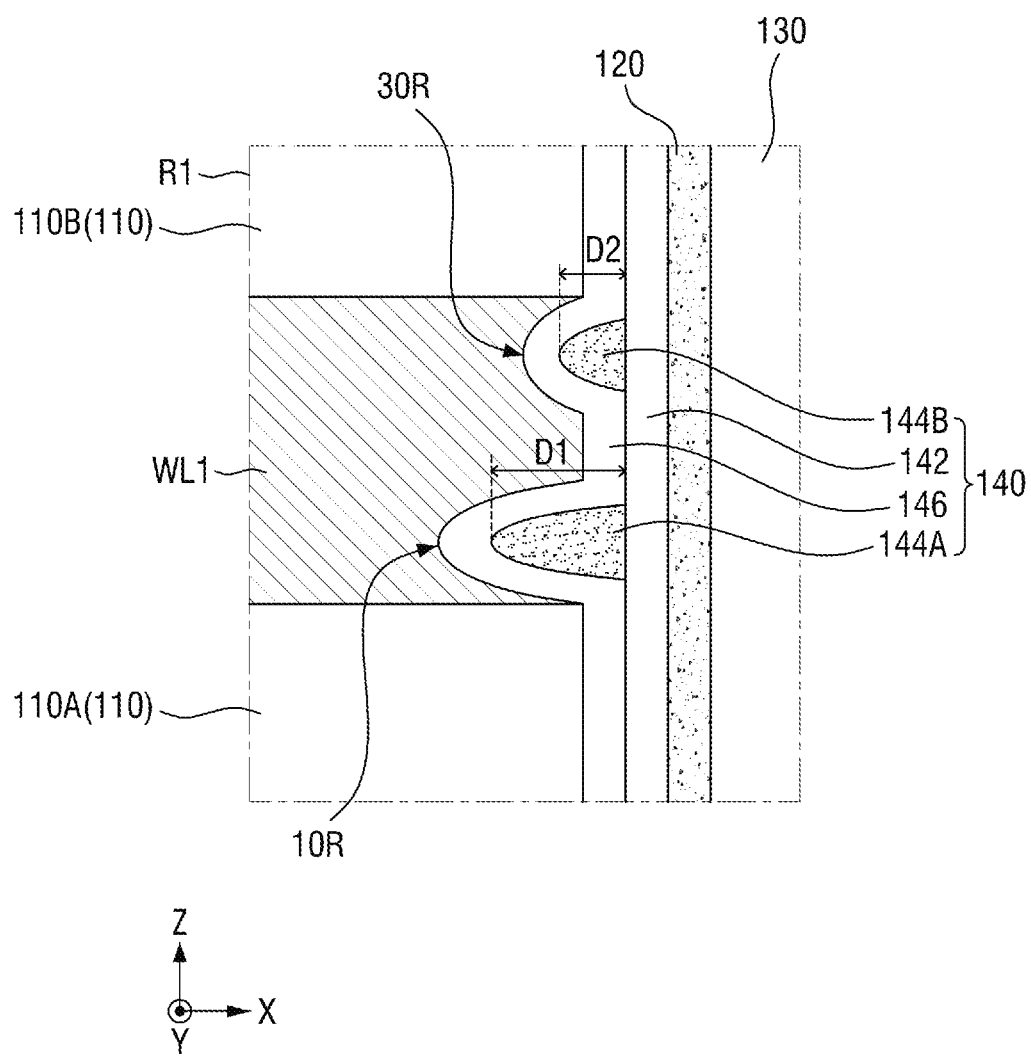

Referring to FIG. 6D, in a nonvolatile memory device according to exemplary embodiments, the first charge storage film 144A and the second charge storage film 144B may have different depths from each other.

A "depth" expressed herein may indicate a depth in a direction that intersects a side surface of the semiconductor pattern 120. For example, in the first direction X, which is substantially perpendicular to the side surface of the semiconductor pattern 120, a first depth D1 of the first charge storage film 144A may be different from a second depth D2 of the second charge storage film 144B.

Although FIG. 6D only illustrates that the first depth D1 of the first charge storage film 144A is greater than the second depth D2 of the second charge storage film 144B, exemplary embodiments are not limited thereto. For example, in exemplary embodiments, the first depth D1 of the first charge storage film 144A may be less than the second depth D2 of the second charge storage film 144B.

According to exemplary embodiments, the first depth D1 of the first charge storage film 144A and the second depth D2 of the second charge storage film 144B may become different according to the position of each of the word lines (WL1, WL2~WLn). For example, with respect to the first word line WL1 disposed on a lower portion among a plurality of word lines (WL1, WL2~WLn), the first depth D1 may be greater than the second depth D2. Differently from the above, with respect to the nth word line WLn disposed on an upper portion among a plurality of word lines (WL1, WL2~WLn), the first depth D1 may be less than the second depth D2.

Figure 7:
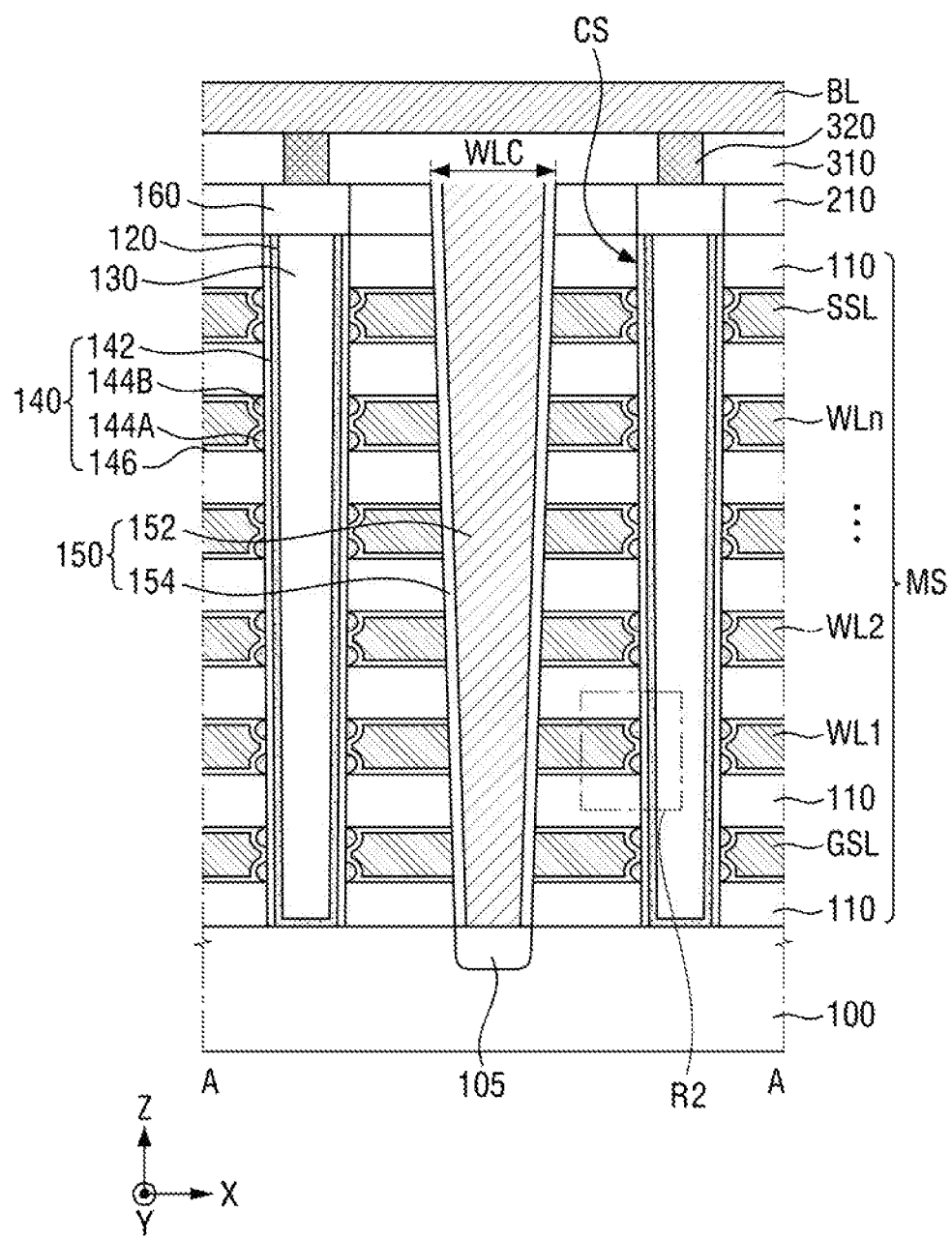
FIG. 7 is a cross-sectional view provided to describe a non-volatile memory device according to exemplary embodiments of the present disclosure.
Figure 8:
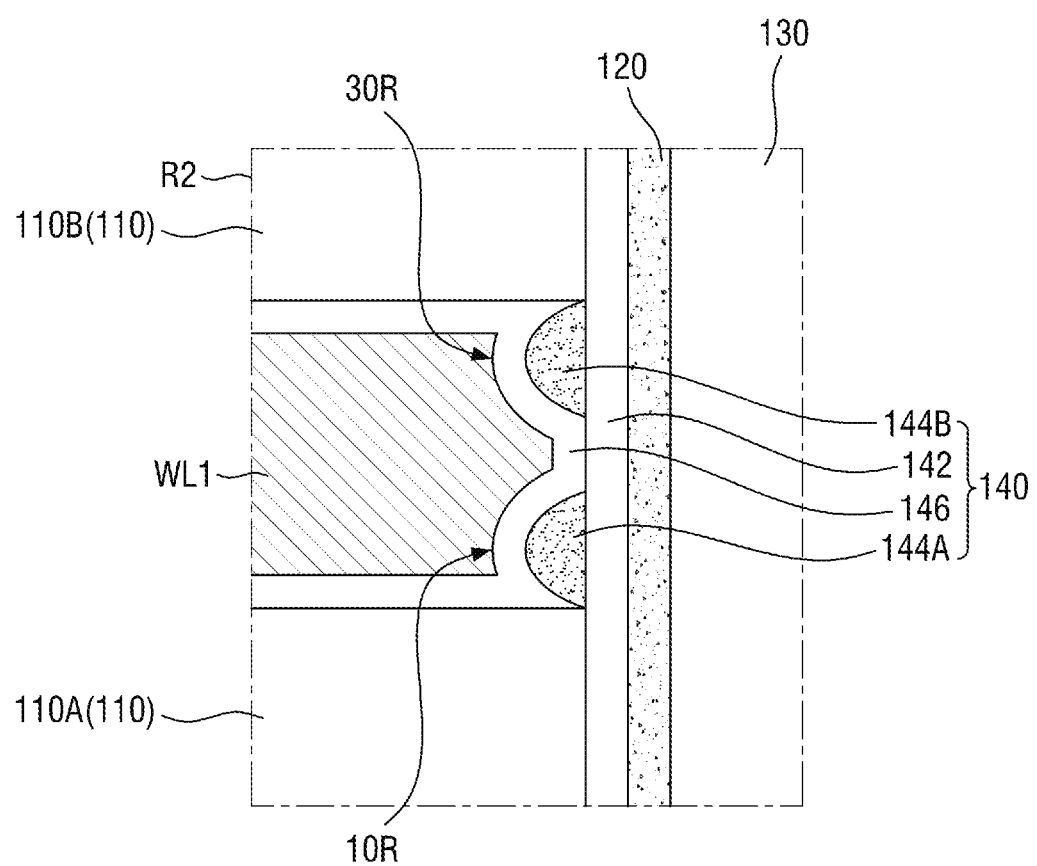
FIG. 8 is an enlarged view of region R2 of FIG. 7 according to exemplary embodiments of the present disclosure.

FIG. 7 is a cross-sectional view provided to describe a non-volatile memory device according to exemplary embodiments of the present disclosure. FIG. 8 is an enlarged view of region R2 of FIG. 7 according to exemplary embodiments of the present disclosure. For convenience of explanation, a further description of elements and aspects previously described with reference to FIGS. 1 to 6D may be omitted or only briefly described.

Referring to FIGS. 7 and 8, in a nonvolatile memory device according to exemplary embodiments, the blocking insulating film 146 may extend along a surface of each of the gate electrodes (GSL, WL1, WL2~WLn, SSL).

For example, as illustrated in FIG. 8, the blocking insulating film 146 may extend further along a bottom surface and an upper surface of the first word line WL1 (e.g., in the first direction X). Accordingly, portions of the blocking insulating film 146 may be interposed between the first insulating pattern 110A and the first word line WL1 and between the second insulating pattern 110B and the first word line WL1.

According to exemplary embodiments, the blocking insulating film 146 does not extend along a side surface of the first insulating pattern 110A and a side surface of the second insulating pattern 110B. Accordingly, in these exemplary embodiments, the blocking insulating film 146 is not interposed between the first insulating pattern 110A and the tunnel insulating film 142 and between the second insulating pattern 110B and the tunnel insulating film 142.

According to exemplary embodiments, the first charge storage film 144A and the second charge storage film 144B may be in contact (e.g., direct contact) with the insulating patterns 110. For example, the first charge storage film 144A may be in contact (e.g., direct contact) with the first insulating pattern 110A, and the second charge storage film 144B may be in contact (e.g., direct contact) with the second insulating pattern 110B.

Figure 9:
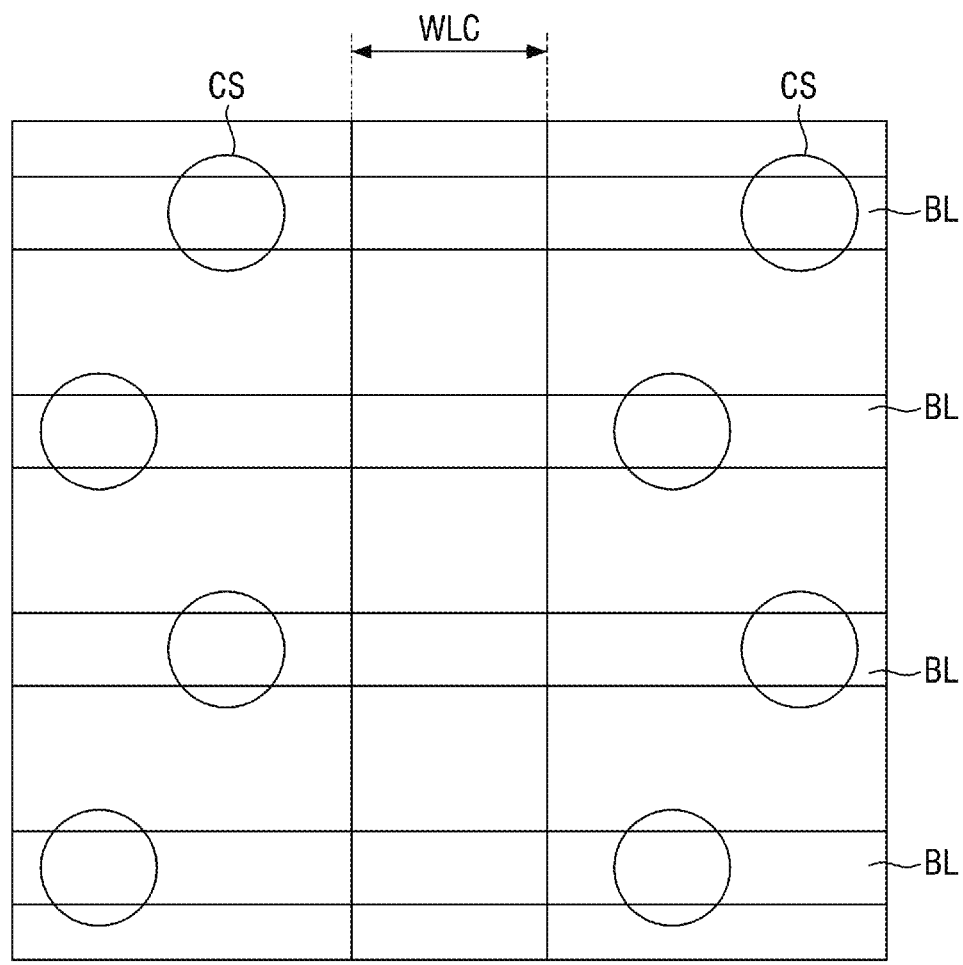
FIG. 9 is a schematic layout view provided to describe a non-volatile memory device according to exemplary embodiments of the present disclosure.

FIG. 9 is a schematic layout view provided to describe a non-volatile memory device according to exemplary embodiments of the present disclosure. For convenience of explanation, a further description of elements and aspects previously described with reference to FIGS. 1 to 6D may be omitted or only briefly described.

Referring to FIG. 9, in a nonvolatile memory device according to exemplary embodiments, a plurality of channel structures (CS) may be arranged in a zigzag form.

A plurality of channel structures (CS) arranged in a zigzag form may further improve the integration density of the nonvolatile memory device.

Hereinbelow, a method for fabricating a nonvolatile memory device according to exemplary embodiments will be described with reference to FIGS. 2 to 6D, 7 and 8, and FIGS. 10 to 28.

FIGS. 10 to 23 are views illustrating intermediate stages of fabrication, and are provided to describe a method for fabricating a nonvolatile memory device according to exemplary embodiments. For convenience of explanation, a further description of elements and aspects previously described with reference to FIGS. 1 to 6D may be omitted or shortened.

Figure 10:
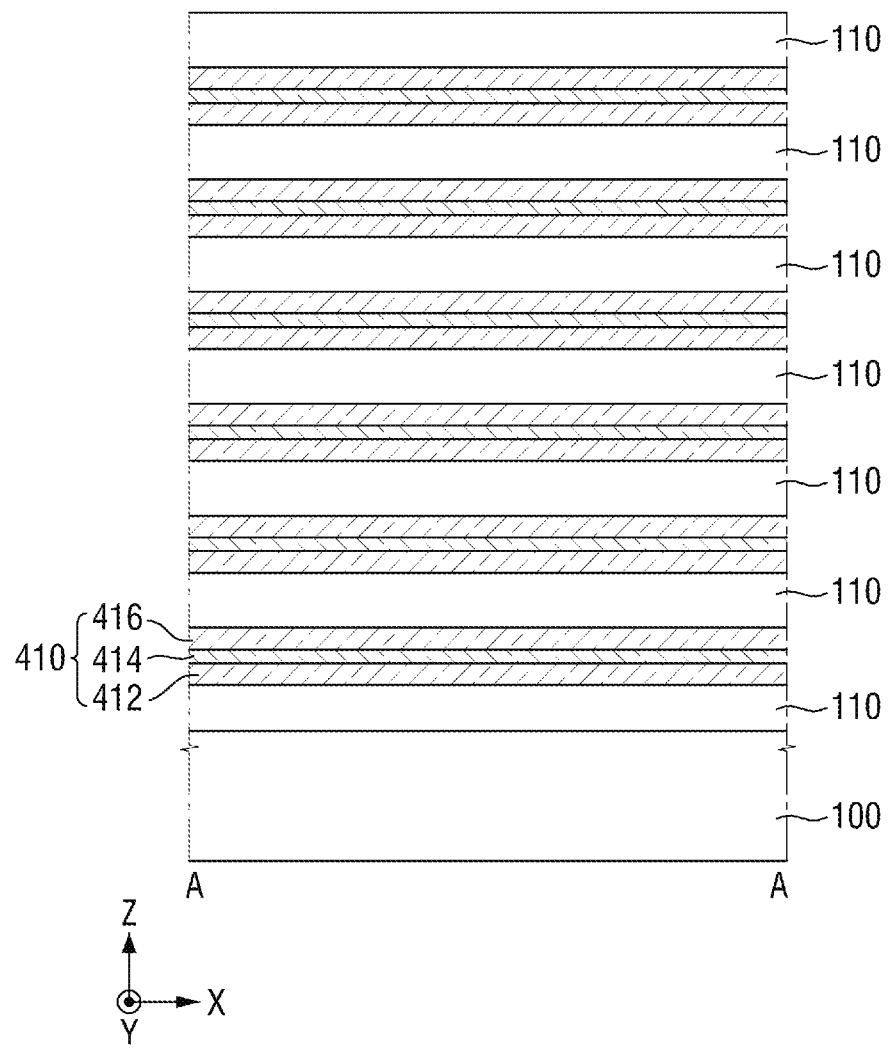
FIGS. 10 to 23 are views illustrating intermediate stages of fabrication, and are provided to describe a method for fabricating a nonvolatile memory device according to exemplary embodiments of the present disclosure.

Referring to FIG. 10, a plurality of insulating patterns 110 and a plurality of sacrificial patterns 410 may be formed on the substrate 100.

Each of the sacrificial patterns 410 may be alternately stacked with each of the insulating patterns 110. For example, a plurality of sacrificial patterns 410 may be separated from one another along the third direction Z and sequentially stacked. Herein, each of the insulating patterns 110 may be interposed between a plurality of sacrificial patterns 410.

A plurality of sacrificial patterns 410 may include a material having etch selectivity with a plurality of insulating patterns 110. For example, when a plurality of insulating patterns 110 includes silicon oxide, a plurality of sacrificial patterns 410 may include silicon nitride.

According to exemplary embodiments, each of the sacrificial patterns 410 may include first to third sacrificial films 412, 414, 416, which are sequentially stacked on the substrate 100. For example, a second sacrificial film 414 may be interposed between a first sacrificial film 412 and a third sacrificial film 416.

According to exemplary embodiments, the first sacrificial film 412 and the third sacrificial film 416 may include a material having etch selectivity with the second sacrificial film 414. For example, when the first to third sacrificial films 412, 414, 416 include silicon nitride SiN, ratios of nitrogen to silicon (N/Si) of the first sacrificial film 412 and the third sacrificial film 416 may be different from a ratio of nitrogen to silicon (N/Si) of the second sacrificial film 414. According to exemplary embodiments, ratios of nitrogen to silicon (N/Si) of the first sacrificial film 412 and the third sacrificial film 416 may be less than a ratio of nitrogen to silicon (N/Si) of the second sacrificial film 414.

A ratio of nitrogen to silicon (N/Si) of the first sacrificial film 412 may be the same as a ratio of nitrogen to silicon (N/Si) of the third sacrificial film 416, or they may be different from each other.

Figure 11:
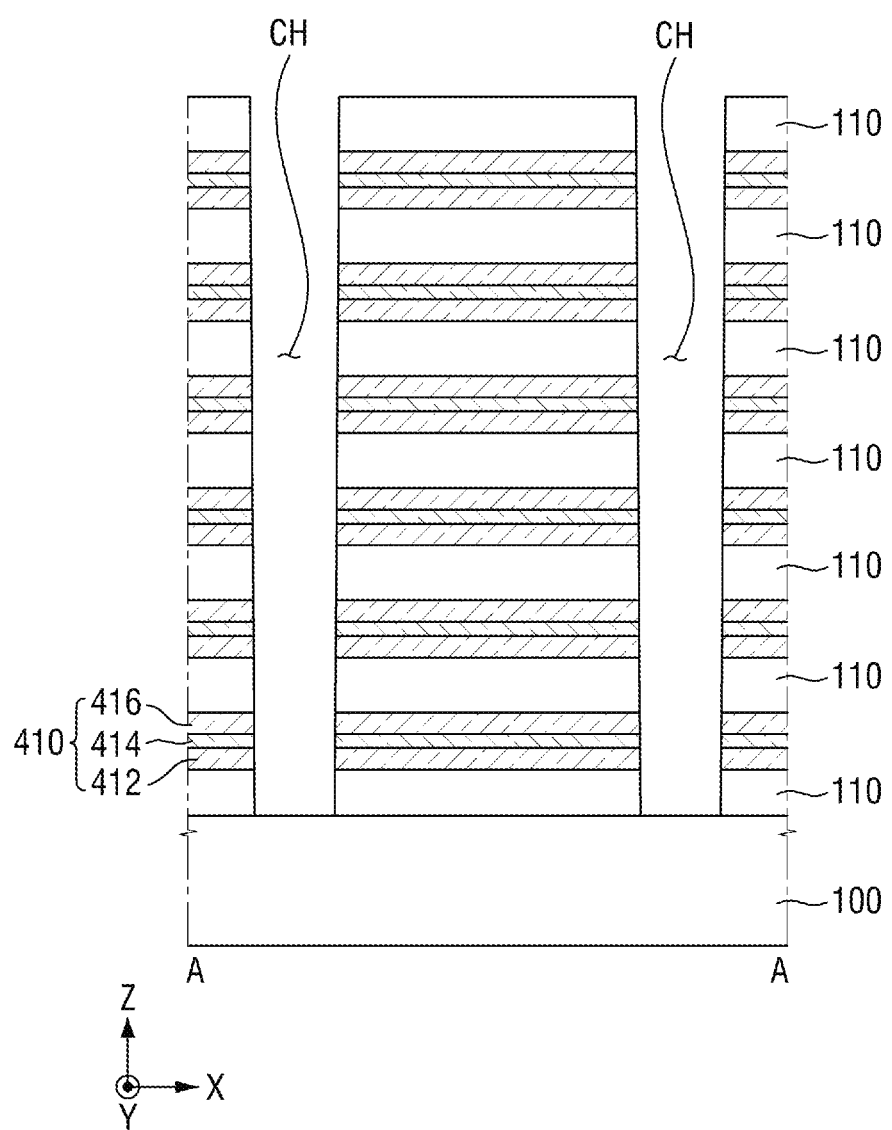

Referring to FIG. 11, a plurality of channel holes (CH) penetrating through a plurality of insulating patterns 110 and a plurality of sacrificial patterns 410 may be formed.

The channel holes (CH) may be formed to penetrate through a plurality of insulating patterns 110 and a plurality of sacrificial patterns 410 so as to expose a portion of the substrate 100.

According to exemplary embodiments, the channel holes (CH) may have a tapered shape. For example, a width of each of the channel holes (CH) may become narrower as each of the channel holes (CH) get closer to the substrate 100. A shape of the channel hole (CH) may be caused as a result of the characteristics of an etch process used for forming the channel hole (CH). However, exemplary embodiments are not limited thereto.

Figure 12:
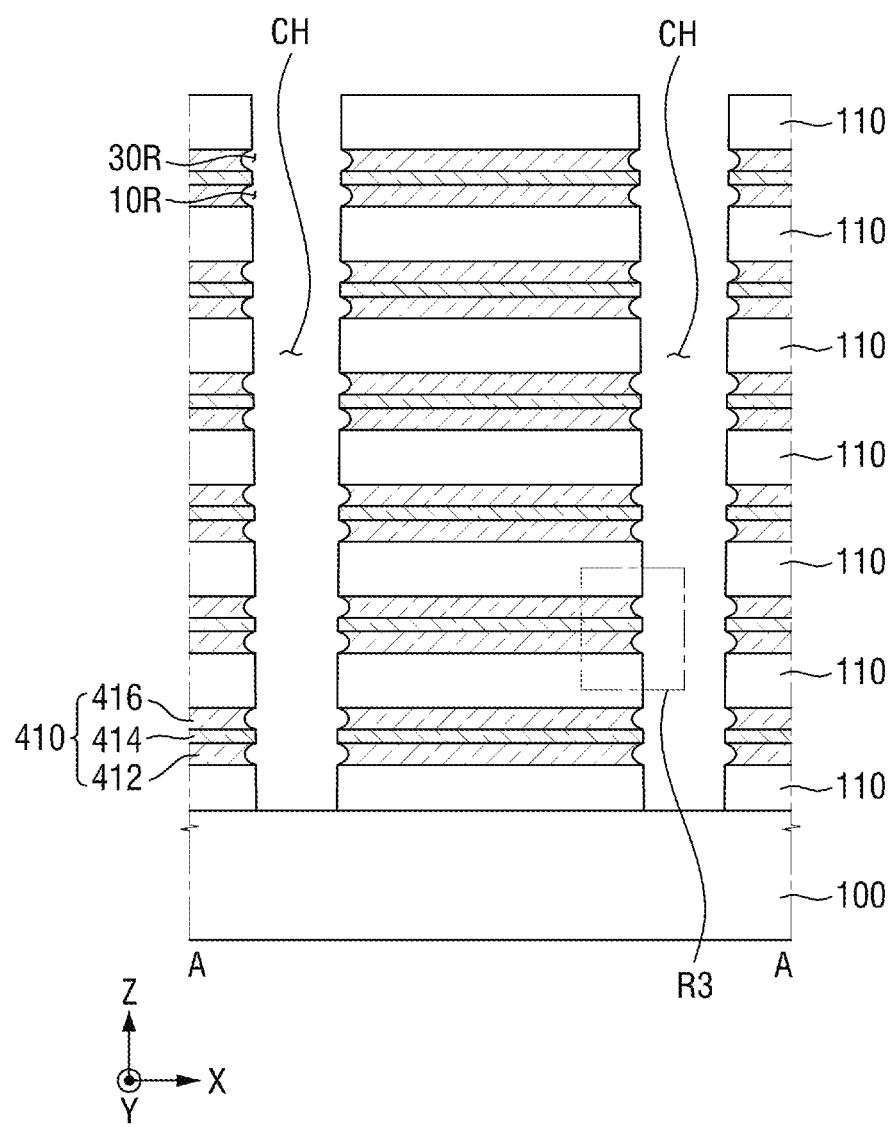
Figure 13:
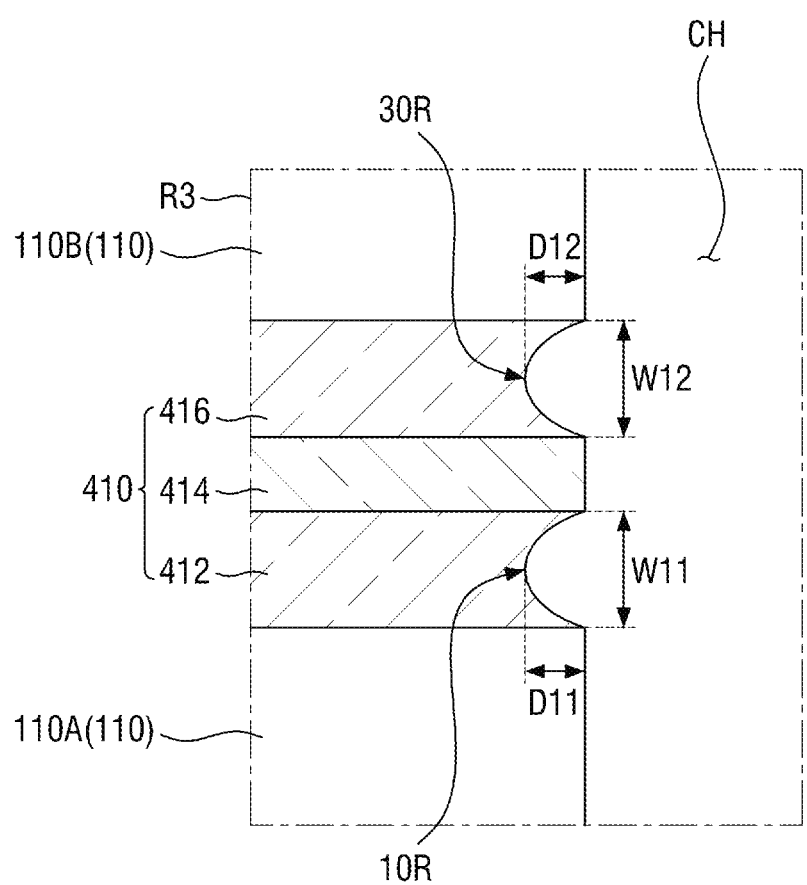

Referring to FIGS. 12 and 13, a recess formation process with respect to the first sacrificial film 412 and the third sacrificial film 416 may be performed. For reference, FIG. 13 is an enlarged view of region R3 of FIG. 12.

The recess formation process may have etch selectivity with respect to the first sacrificial film 412 and the third sacrificial film 416. For example, the recess formation process may selectively etch a portion of the first sacrificial film 412 and a portion of the third sacrificial film 416 which are exposed by the channel hole (CH). On the contrary, in exemplary embodiments, the second sacrificial film 414 and a plurality of insulating patterns 110 are not etched to form a recess during the recess formation process.

Accordingly, a side surface of the first sacrificial film 412 and a side surface of the third sacrificial film 416 may extend further into their respective films than a side surface of the second sacrificial film 414. For example, the first recess 10R may be formed within the first sacrificial film 412 and the second recess 30R may be formed within the third sacrificial film 416.

Although it is illustrated that a width of the first recess 10R and a width of the second recess 30R are substantially the same as each other, exemplary embodiments are not limited thereto. For example, in exemplary embodiments, a third width W11 of the first recess 10R and a fourth width W12 of the second recess 30R may be substantially the same as each other, or they may be different from each other. For example, when a thickness of the first sacrificial film 412 is greater than a thickness of the third sacrificial film 416, the third width W11 may be greater than the fourth width W12.

Further, although it is illustrated that a depth of the first recess 10R and a depth of the second recess 30R are substantially the same as each other, exemplary embodiments are not limited thereto. For example, in exemplary embodiments, a third depth D11 of the first recess 10R and a fourth depth D12 of the second recess 30R may be substantially the same as each other, or they may be different from each other. For example, when a ratio of nitrogen to silicon (N/Si) of the first sacrificial film 412 is less than a ratio of nitrogen to silicon (N/Si) of the third sacrificial film 416, the third depth D11 may be greater than the fourth depth D12.

Figure 14:
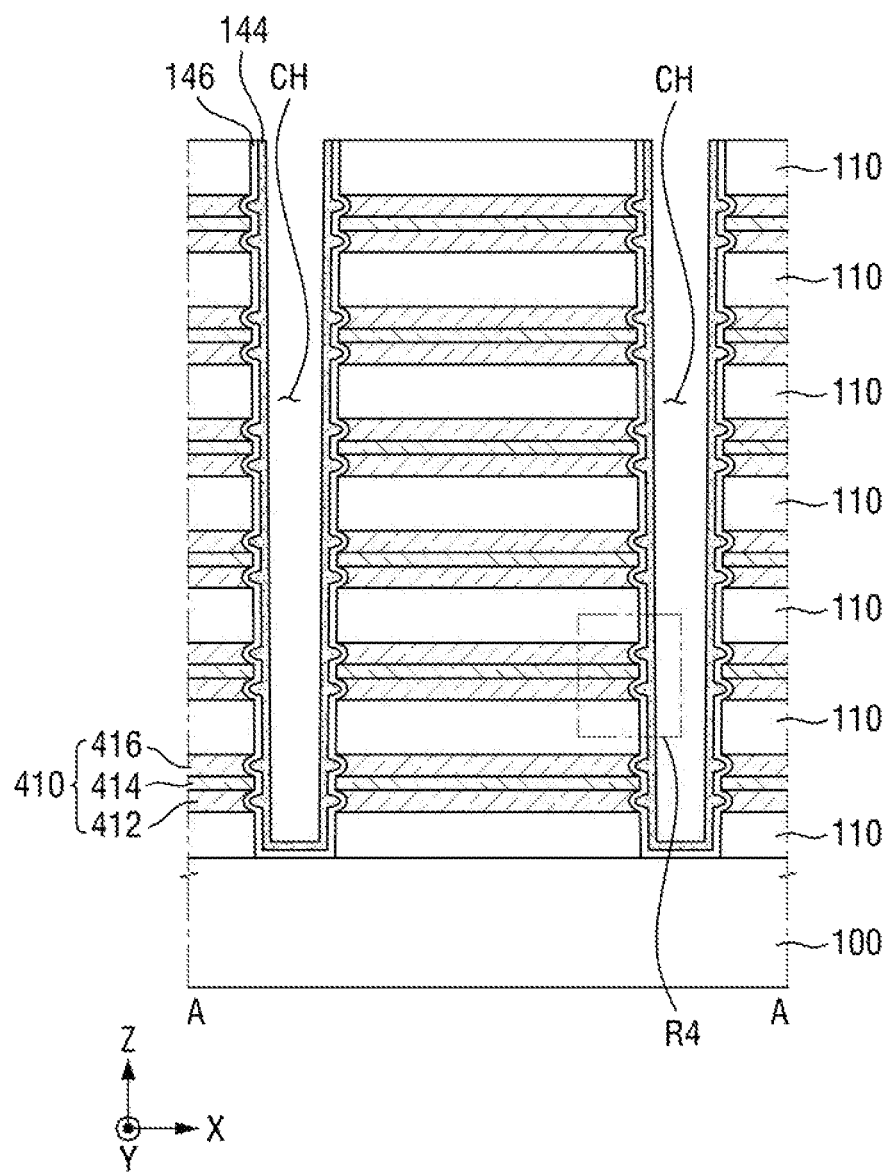
Figure 15:
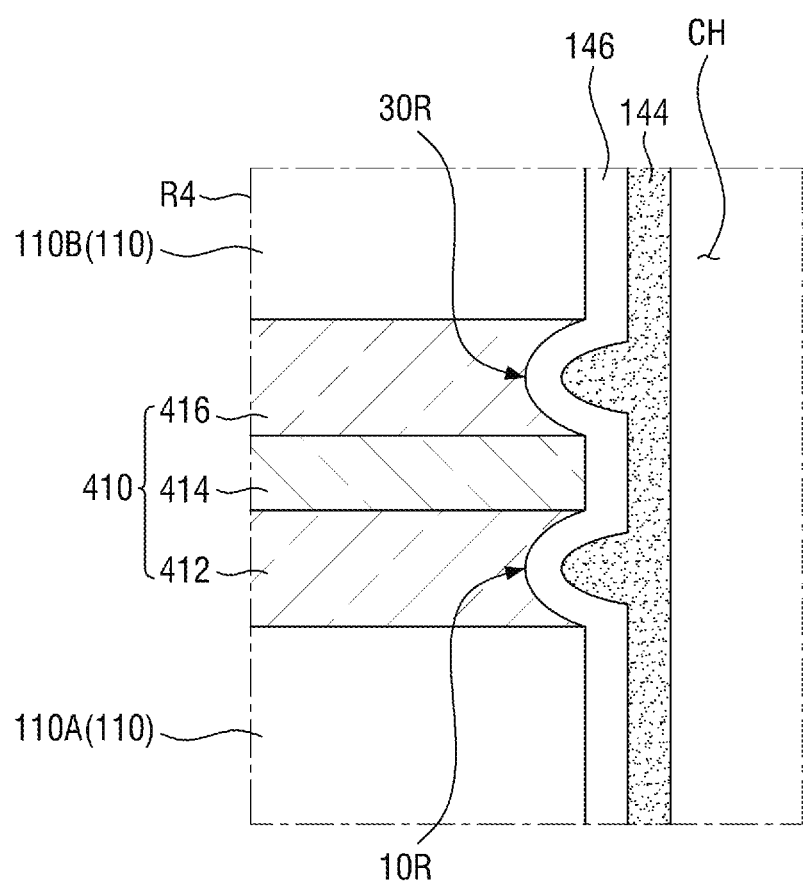

Referring to FIGS. 14 and 15, the blocking insulating film 146 and a preparatory charge storage film 144 may be sequentially formed within each of the channel holes (CH). For reference, FIG. 15 is an enlarged view of region R4 of FIG. 14.

First, the blocking insulating film 146 extending along a profile of the channel hole (CH) may be formed. The blocking insulating film 146 may extend along a side surface of a plurality of sacrificial patterns 410 and a side surface of a plurality of insulating patterns 110. For example, as illustrated in FIG. 15, the blocking insulating film 146 may continuously extend along a profile with respect to a side surface of the first insulating pattern 110A, a side surface of the sacrificial pattern 410, and a side surface of the second insulating pattern 110B.

Next, the preparatory charge storage film 144 may be formed on the blocking insulating film 146. The preparatory charge storage film 144 may extend along a profile of the blocking insulating film 146. According to exemplary embodiments, the preparatory charge storage film 144 may be formed to fill the first recess 10R and the second recess 30R.

Figure 16:
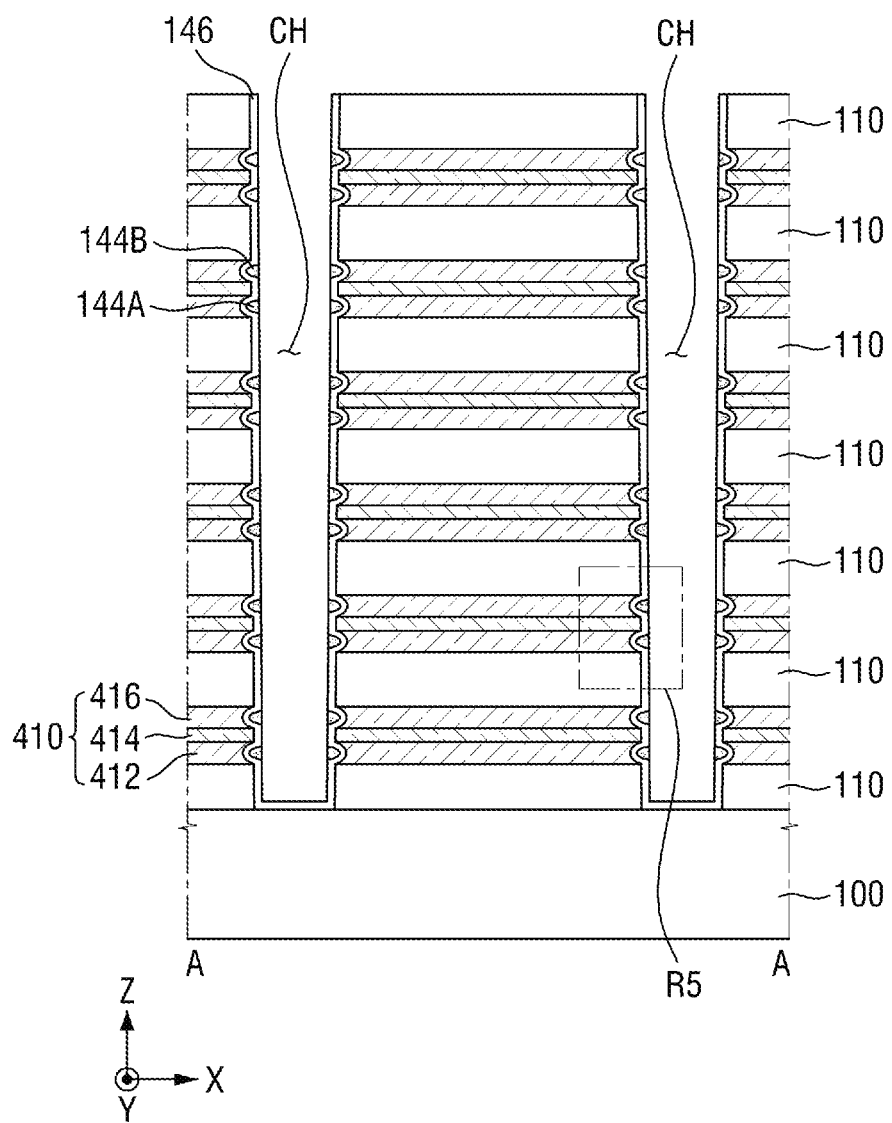
Figure 17:
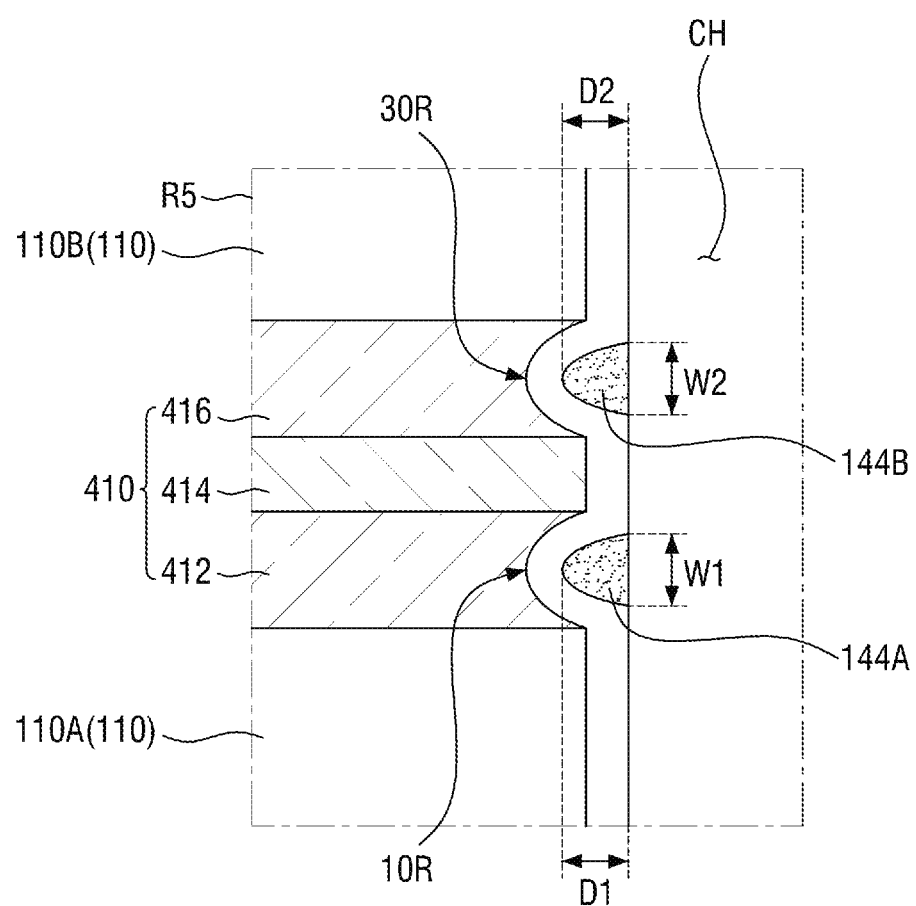

Referring to FIGS. 16 and 17, an etch-back process may be performed on the preparatory charge storage film 144. For reference, FIG. 17 is an enlarged view of region R5 of FIG. 16.

According to exemplary embodiments, the etch-back process may be performed until a side surface of the blocking insulating film 146 is exposed. Accordingly, two charge storage films, which are separated from each other in each of the sacrificial patterns 410 (e.g., the first charge storage film 144A and the second charge storage film 144B), may be formed.

Further, two charge storage films (the first charge storage film 144A and the second charge storage film 144B) may be formed in a buried form in each of the sacrificial patterns 410. For example, as illustrated in FIG. 17, the first charge storage film 144A may fill at least a portion of the first recess 10R, and the second charge storage film 144B may fill at least a portion of the second recess 30R.

Although it is illustrated that a width of the first charge storage film 144A is substantially the same as a width of the second charge storage film 144B, exemplary embodiments are not limited thereto. For example, in exemplary embodiments, the first width W1 of the first charge storage film 144A may be substantially the same as the second width W2 of the second charge storage film 144B, or they may be different from each other. For example, when a thickness of the first sacrificial film 412 is greater than a thickness of the third sacrificial film 416, the first width W1 may be greater than the second width W2.

Further, although a depth of the first charge storage film 144A and a depth of the second charge storage film 144B are illustrated as being substantially the same as each other, exemplary embodiments are not limited thereto. For example, a first depth D1 of the first charge storage film 144A may be substantially the same as a second depth D2 of the second charge storage film 144B, or they may be different from each other. For example, when a ratio of nitrogen to silicon (N/Si) of the first sacrificial film 412 is less than a ratio of nitrogen to silicon (N/Si) of the third sacrificial film 416, the first depth D1 may be greater than the second depth D2.

Figure 18:
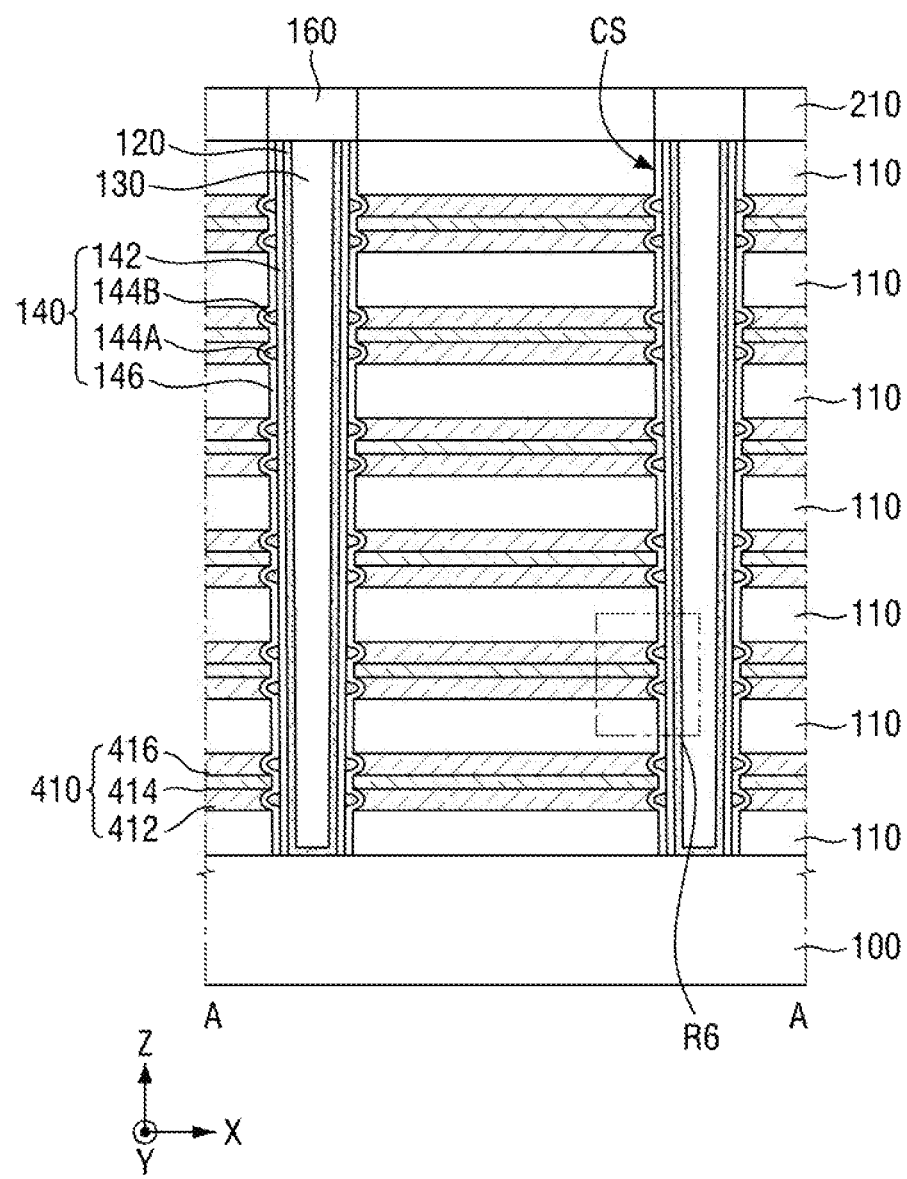
Figure 19:
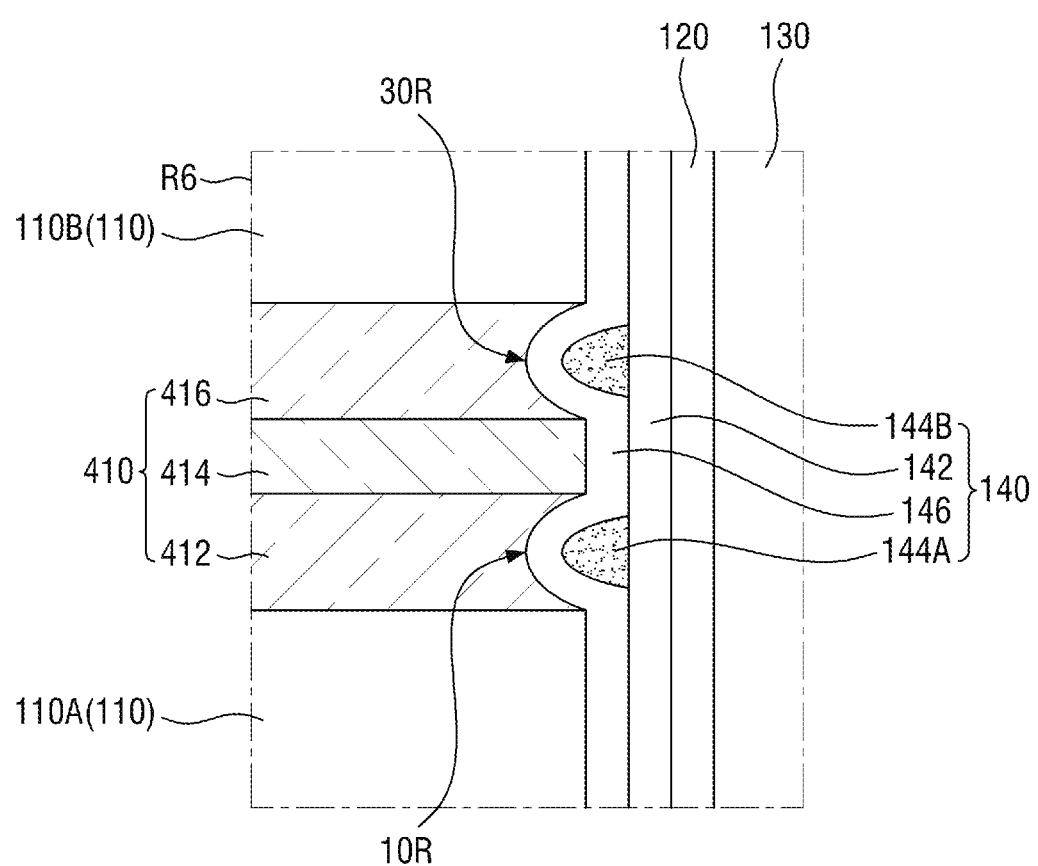

Referring to FIGS. 18 and 19, a plurality of channel structures (CS) may be formed. For reference, FIG. 19 is an enlarged view of region R6 of FIG. 18.

For example, the tunnel insulating film 142 and the semiconductor pattern 120 may be sequentially formed within each of the channel holes (CH). The tunnel insulating film 142 may extend, for example, along a side surface of the first charge storage film 144A, a second side surface of the second charge storage film 144B, and a side surface of the blocking insulating film 146. For example, the semiconductor pattern 120 may be in contact (e.g., direct contact) with the substrate 100 as extending in the third direction Z. Accordingly, a plurality of channel structures (CS) penetrating through a plurality of insulating patterns 110 and a plurality of sacrificial patterns 410 may be formed to be in contact (e.g., direct contact) with the substrate 100.

According to exemplary embodiments, the filling insulating pattern 130 may be further formed on the semiconductor pattern 120. The filling insulating pattern 130 may be formed to fill an inner portion of the semiconductor pattern 120 which may be, for example, a cup shape.

Figure 20:
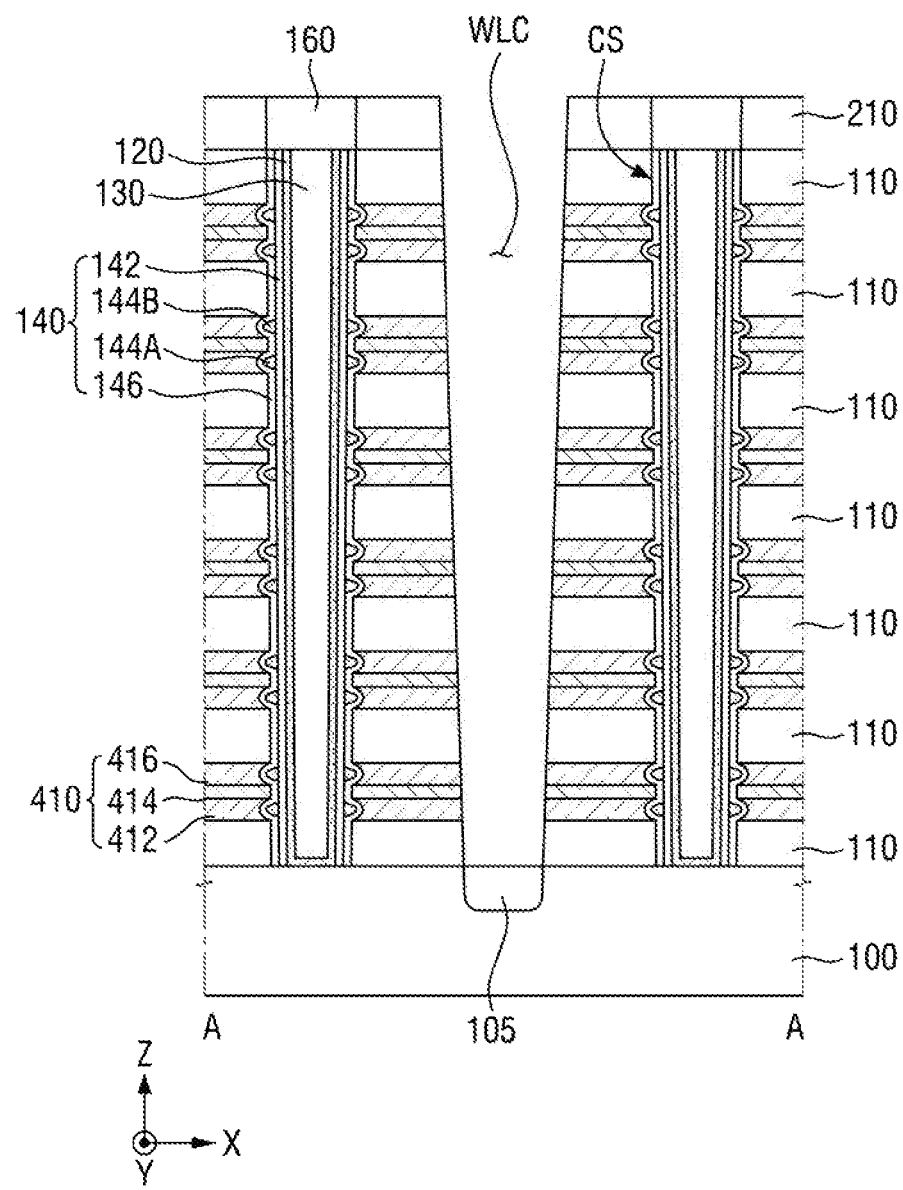

According to exemplary embodiments, the channel pad 160 in contact (e.g., direct contact) with an upper portion of the semiconductor pattern 120 may be further formed (see FIG. 20). The channel pad 160 may be formed, for example, within the first interlayer insulating film 210 formed on a plurality of insulating patterns 110 and a plurality of sacrificial patterns 410.

Referring to FIG. 20, a word line cut region (WLC) may be formed within a plurality of insulating patterns 110 and a plurality of sacrificial patterns 410.

The word line cut region (WLC) may be formed to expose the substrate 100, by penetrating through a plurality of insulating patterns 110 and a plurality of sacrificial patterns 410. Accordingly, the word line cut region (WLC) may cut a plurality of insulating patterns 110 and a plurality of sacrificial patterns 410.

According to exemplary embodiments, the word line cut region (WLC) may be formed to extend in the second direction Y. According to exemplary embodiments, an impurity region 105 may be formed within the substrate 100 in the area exposed by the word line cut region (WLC).

Figure 21:
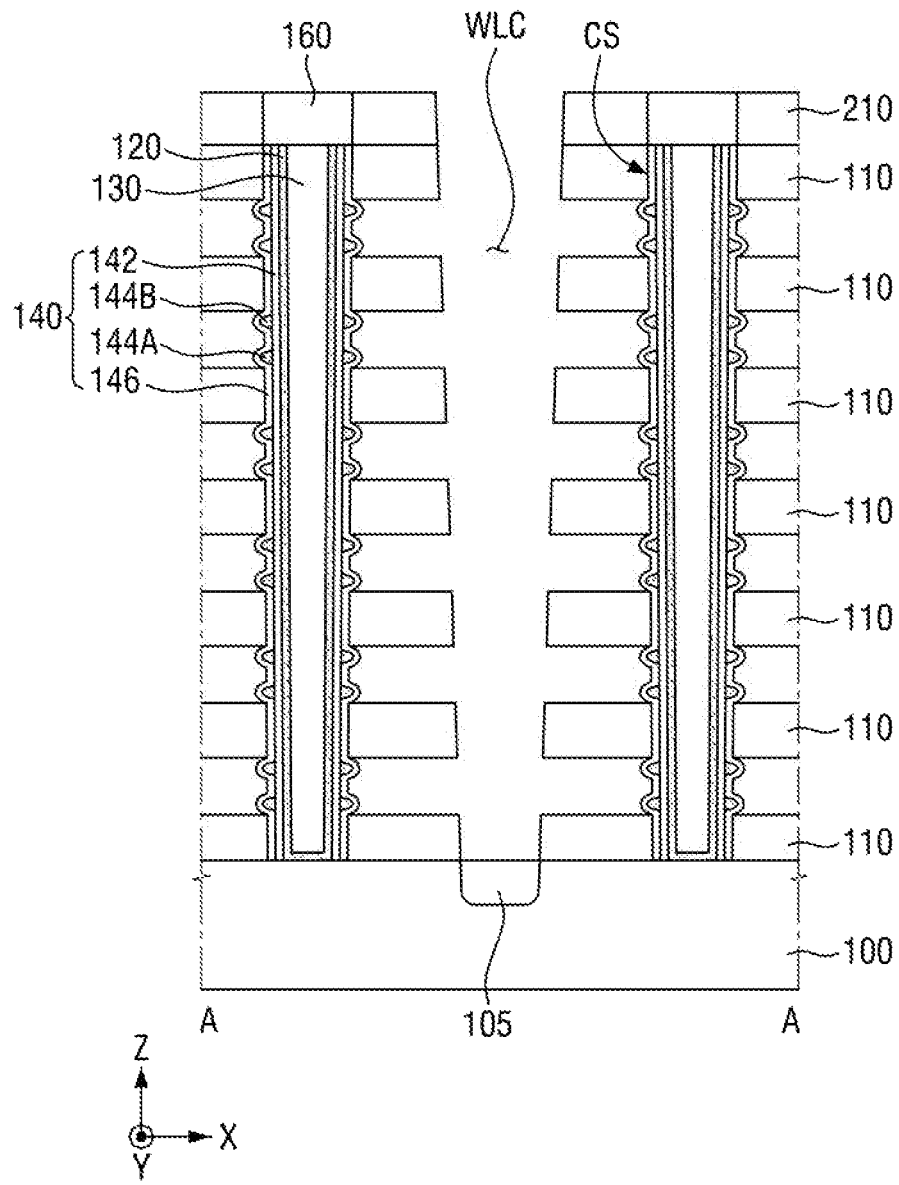

Referring to FIG. 21, a plurality of sacrificial patterns 410 exposed by the word line cut region (WLC) may be removed.

Removal of the plurality of sacrificial patterns 410 may be performed, for example, by an anisotropic etch process. Accordingly, in exemplary embodiments, a portion of a side surface of the blocking insulating film 146 may be exposed.

Figure 22:
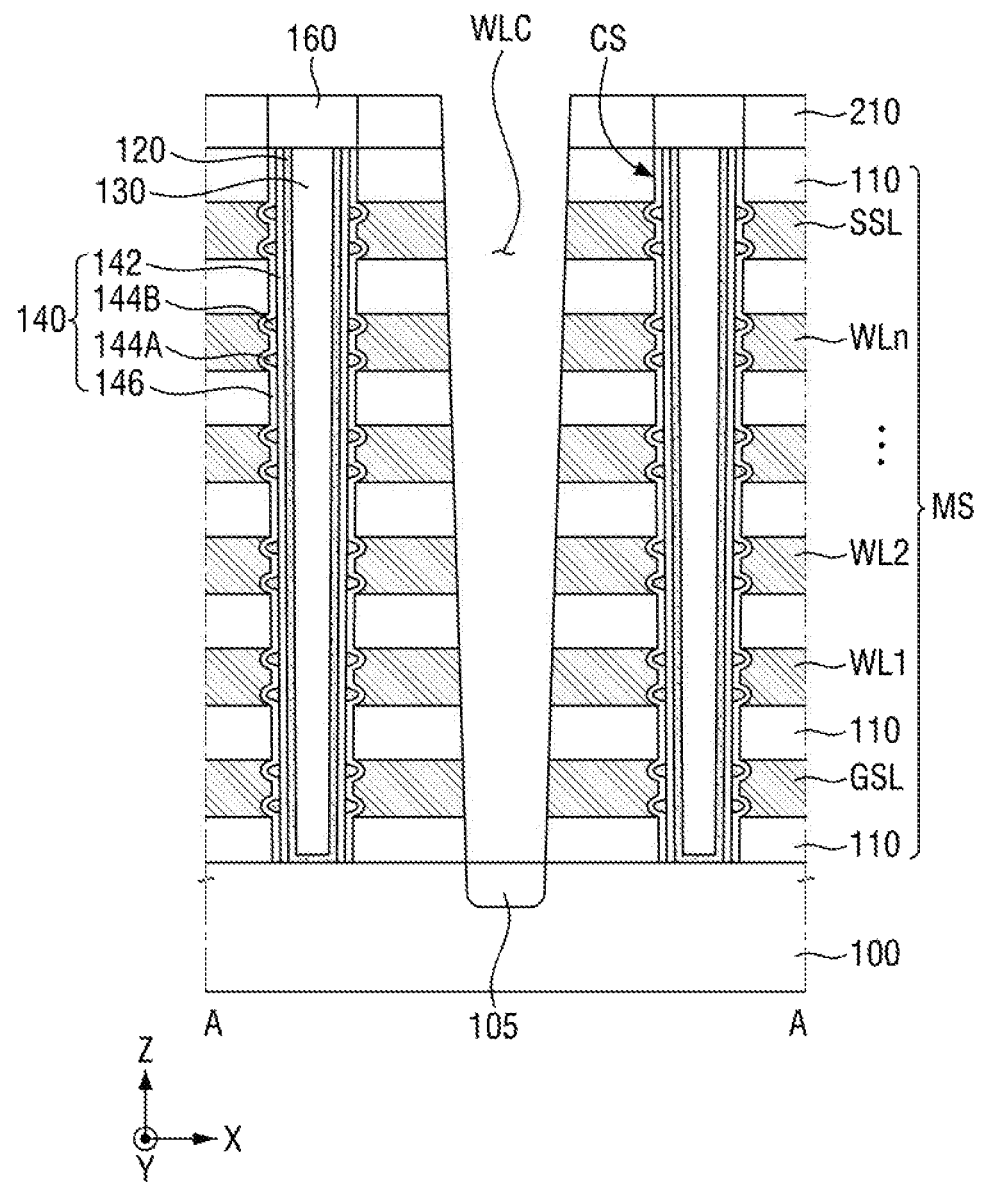

Referring to FIG. 22, a plurality of gate electrodes (GSL, WL1, WL2~WLn, SSL) may be formed.

A plurality of gate electrodes (GSL, WL1, WL2~WLn, SSL) may be formed within a region in which a plurality of sacrificial patterns 410 are removed. For example, a plurality of sacrificial patterns 410 may be substituted with a plurality of gate electrodes (GSL, WL1, WL2~WLn, SSL). Further, a mold structure (MS) including a plurality of gate electrodes (GSL, WL1, WL2~WLn, SSL) and a plurality of insulating patterns 110 may be formed on the substrate 100.

Figure 23:
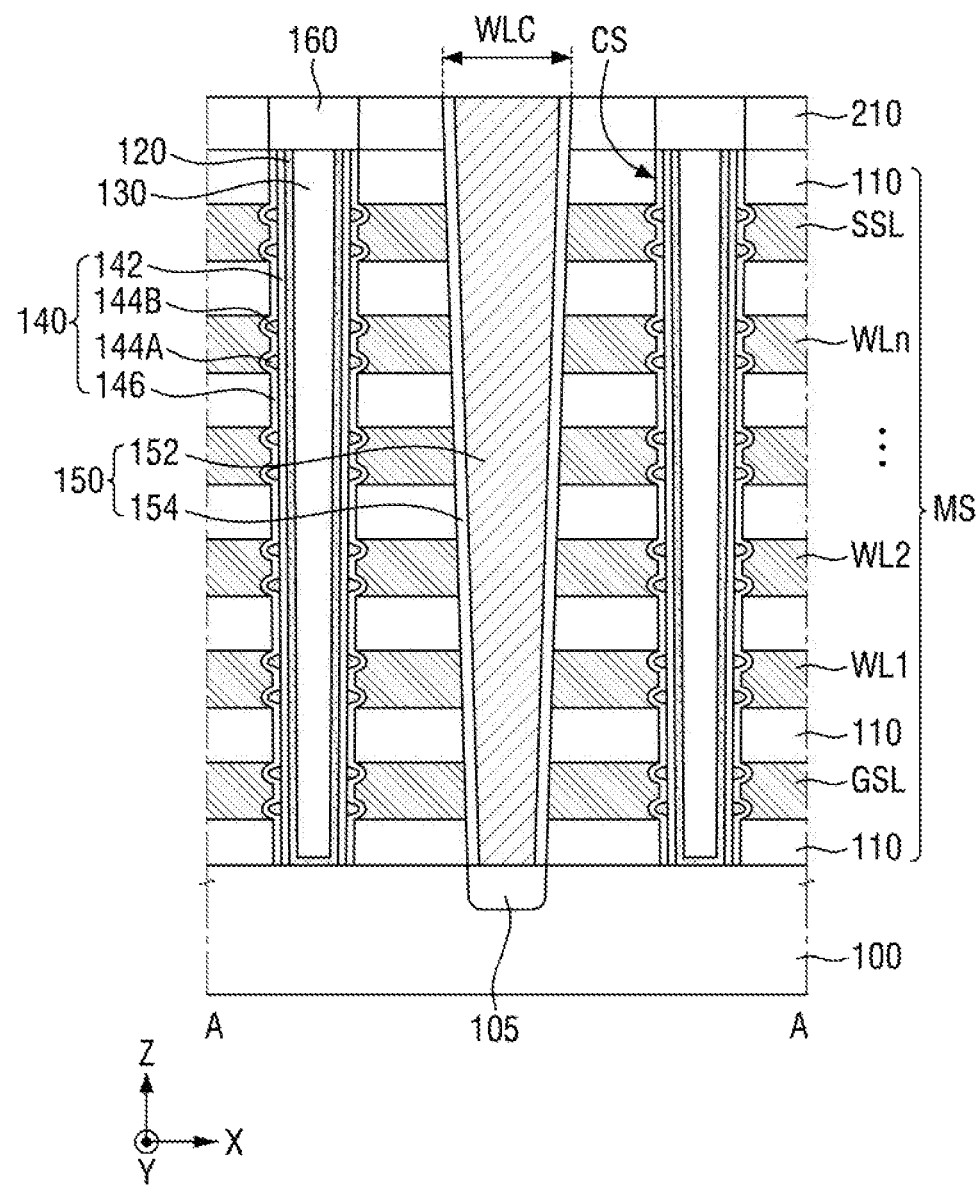

Referring to FIG. 23, an isolation structure 150 may be formed within the word line cut region (WLC).

For example, a spacer 154 may be formed to extend along a profile of the word line cut region (WLC). Next, a plug pattern 152 filling the word line cut region (WLC) may be formed on the spacer 154. The plug pattern 152 may be formed to penetrate through the mold structure (MS) so as to be in contact (e.g., direct contact) with the impurity region 105.

Next, referring to FIG. 3, a plurality of bit lines (BL) may be formed on the mold structure (MS).

A plurality of bit lines (BL) may be formed to be in contact (e.g., direct contact) with a plurality of channel structures (CS). For example, a second interlayer insulating film 310 may be formed on the mold structure (MS). Next, a bit line contact 170 penetrating the second interlayer insulating film 310 and electrically connecting the channel structure (CS) and the bit line (BL) may be formed.

Accordingly, a method for fabricating a nonvolatile memory device having improved integration density, including the formation of two charge storage films per word line, may be provided.

Figure 24:
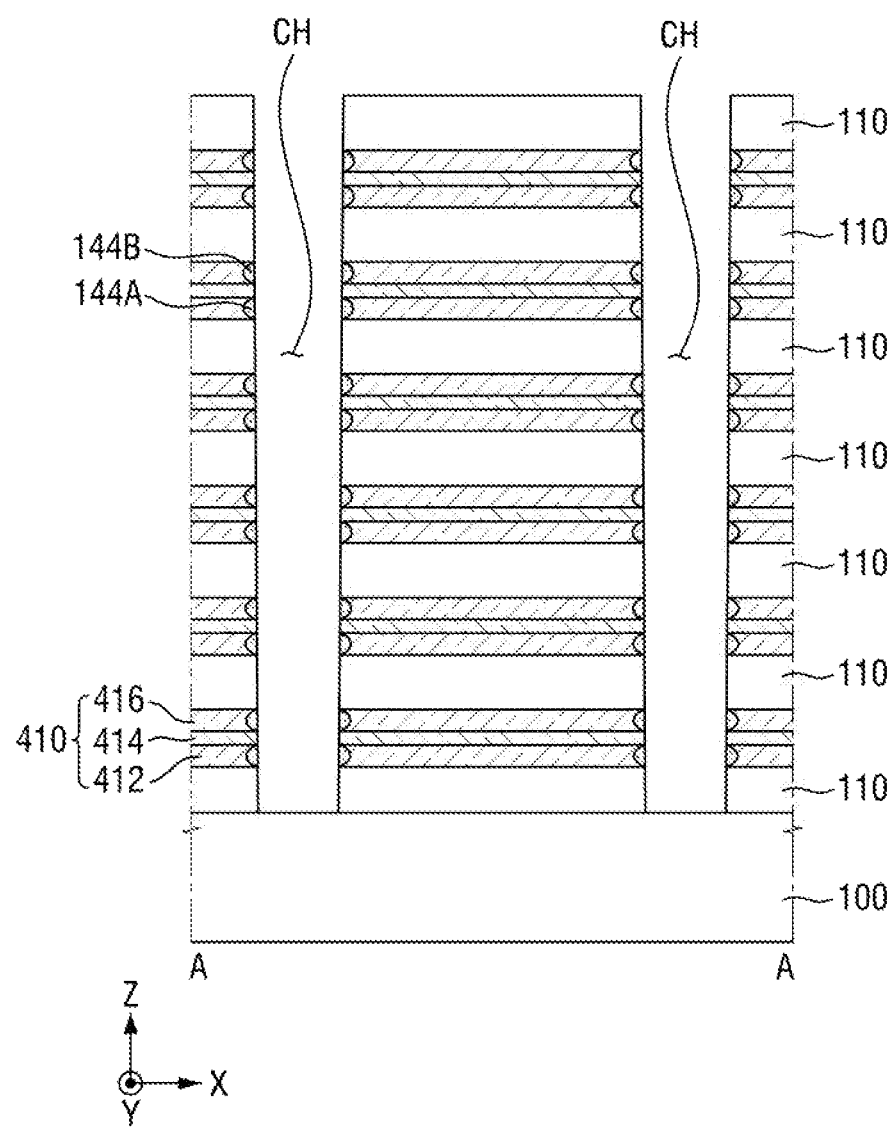
FIGS. 24 to 28 are views illustrating intermediate stages of fabrication, and are provided to describe a method for fabricating a nonvolatile memory device according to exemplary embodiments of the present disclosure.

FIGS. 24 to 28 are views illustrating intermediate stages of fabrication, and are provided to describe a method for fabricating a nonvolatile memory device according to exemplary embodiments of the present disclosure. For convenience of explanation, a further description of elements and aspects previously described with reference to FIGS. 1 to 23 may be omitted or only briefly described. For reference, FIG. 24 is a view provided to describe a process after FIG. 12.

Referring to FIG. 24, a first charge storage film 144A may be formed within a first recess 10R, and a second charge storage film 144B may be formed within a second recess 30R.

According to exemplary embodiments, the first charge storage film 144A and the second charge storage film 144B may be formed to be in contact (e.g., direct contact) with each of sacrificial patterns 410. For convenience of explanation, since formation of the first charge storage film 144A and the second charge storage film 144B is similar to the formation process described above with reference to FIGS. 14 to 17, a further description thereof is not repeated here.

Figure 25:
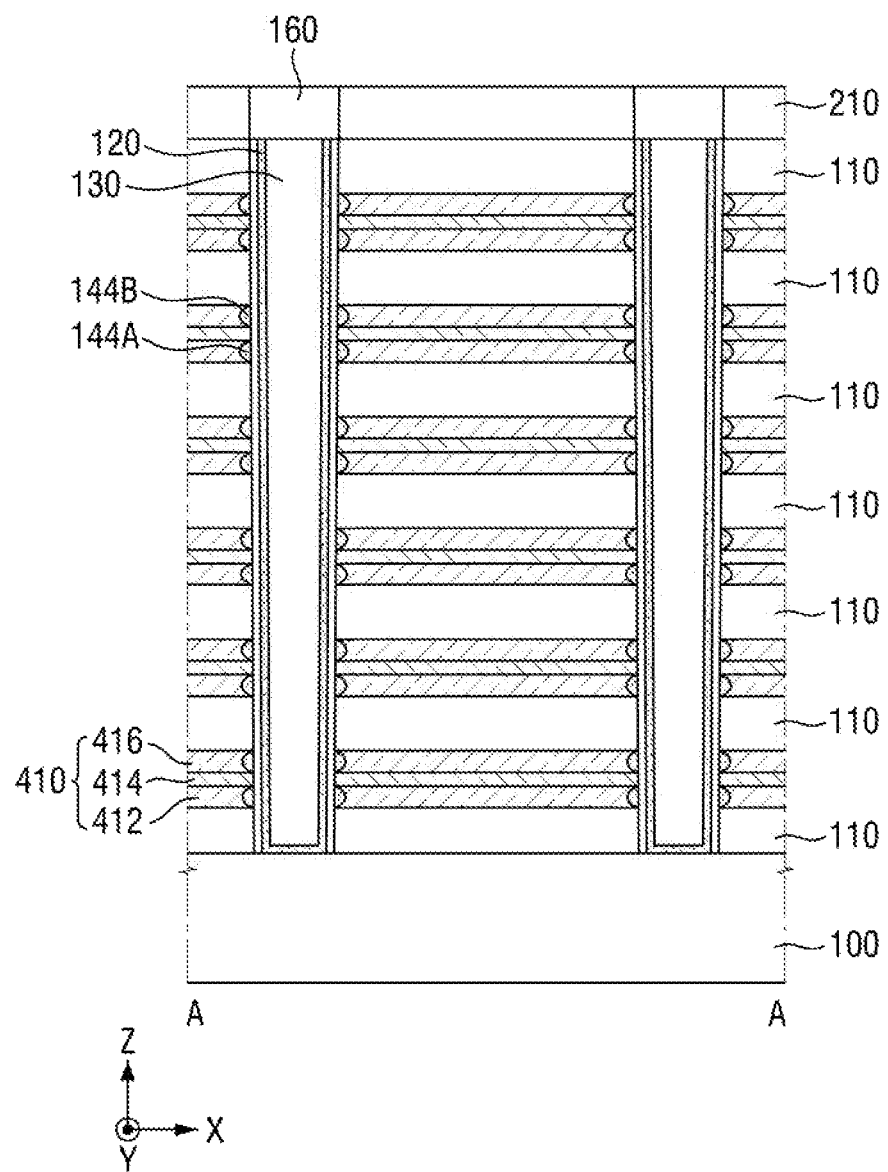

Referring to FIG. 25, a tunnel insulating film 142 and a semiconductor pattern 120 may be formed within each of the channel holes (CH).

According to exemplary embodiments, the filling insulating pattern 130 may be further formed on the semiconductor pattern 120. According to exemplary embodiments, the channel pad 160 in contact (e.g., direct contact) with an upper portion of the semiconductor pattern 120 may be further formed.

For convenience of explanation, since formation of the tunnel insulating film 142, the semiconductor pattern 120, the filling insulating pattern 130 and the channel pad 160 is similar to the formation process described above with reference to FIGS. 18 and 19, a further description thereof is not repeated here.

Figure 26:
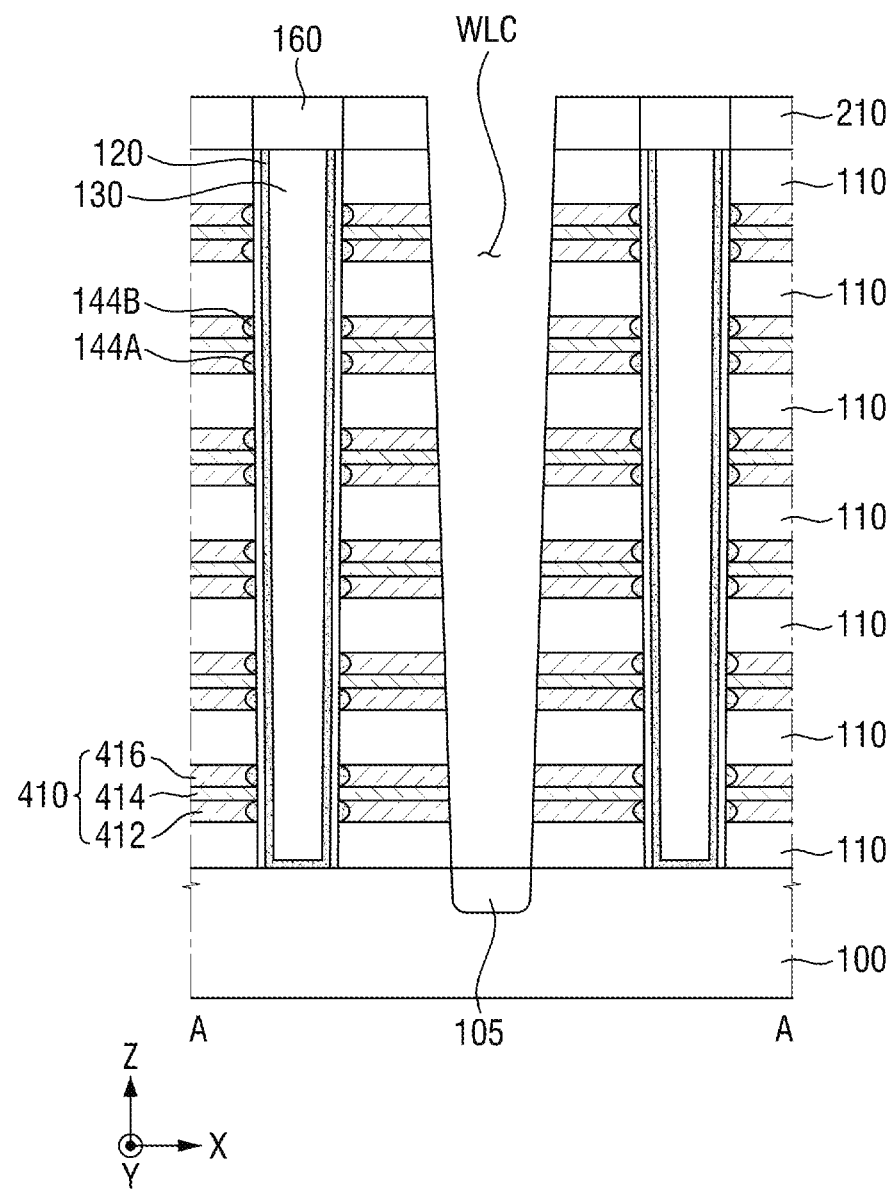

Referring to FIG. 26, the word line cut region (WLC) may be formed within a plurality of insulating patterns 110 and a plurality of sacrificial patterns 410.

For convenience of explanation, since formation of the word line cut region (WLC) is similar to the formation process described above with reference to FIG. 20, a further description thereof is not repeated here.

Figure 27:
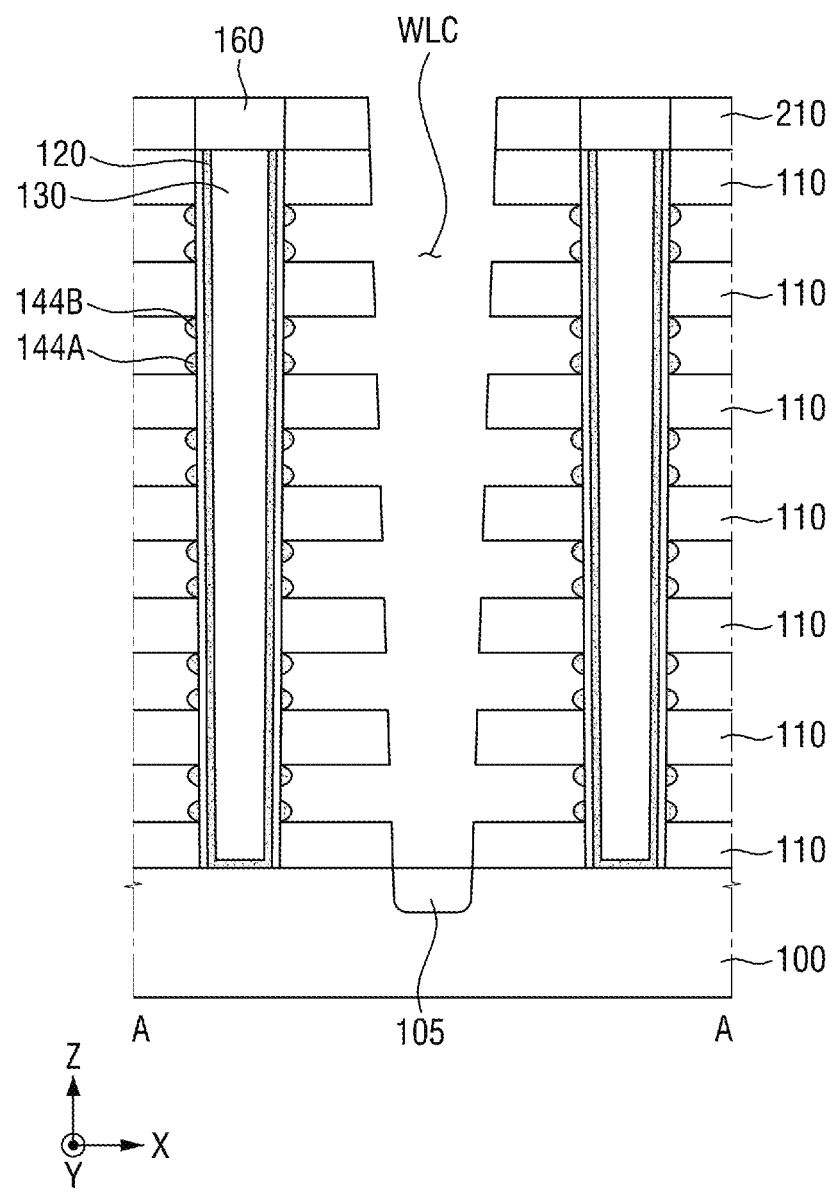

Referring to FIG. 27, a plurality of sacrificial patterns 410 exposed by the word line cut region (WLC) may be removed.

Accordingly, the first charge storage film 144A and the second charge storage film 144B may be exposed. For convenience of explanation, since removal of a plurality of sacrificial patterns 410 is similar to the removal process described above with reference to FIG. 21, a further description thereof is not repeated here.

Figure 28:
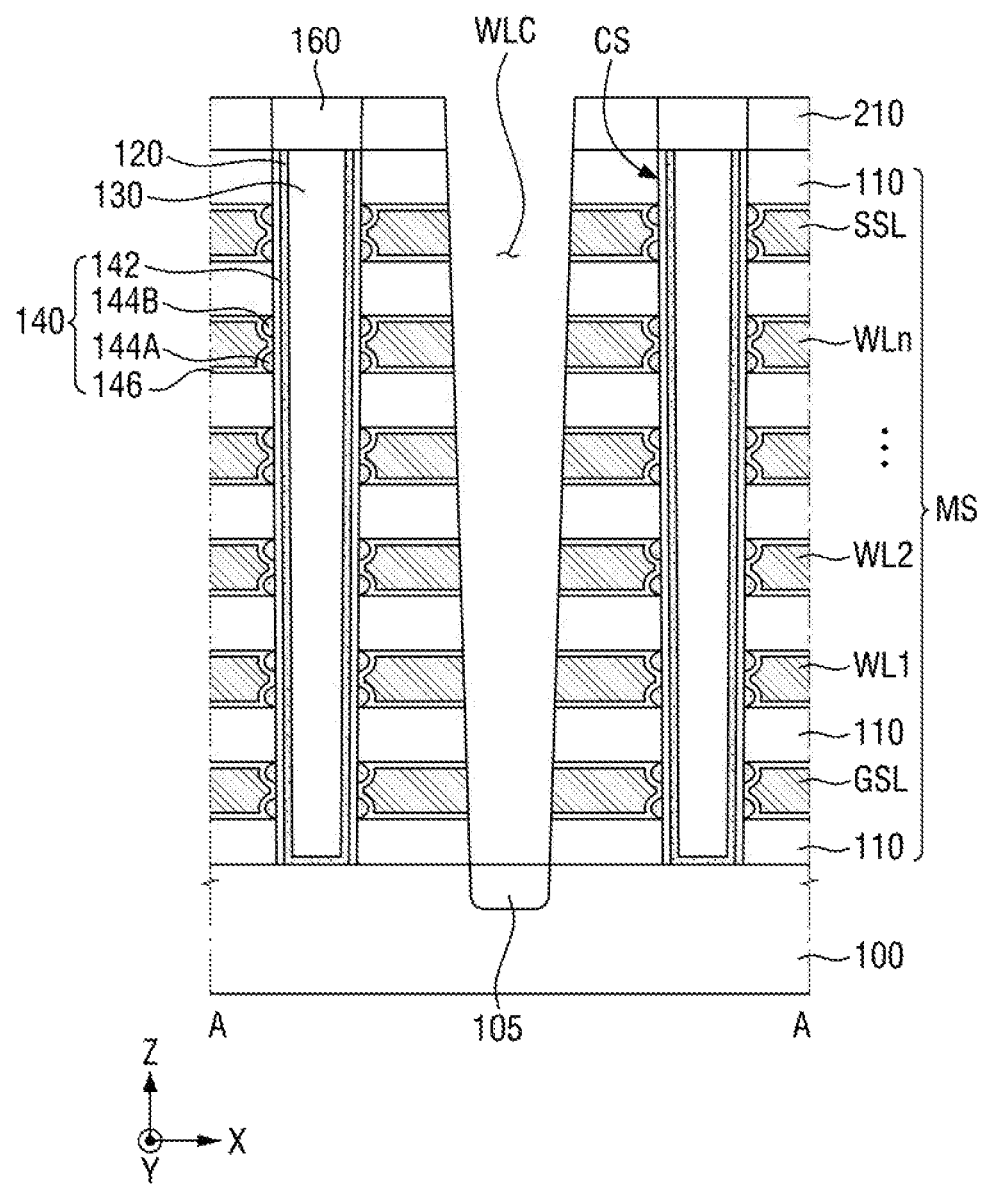

Referring to FIG. 28, a blocking insulating film 146 and a plurality of gate electrodes (GSL, WL1, WL2~WLn, SSL) may be formed.

The blocking insulating film 146 may be formed within a region in which a plurality of sacrificial patterns 410 are removed. For example, the blocking insulating film 146 may extend along a profile with respect to a plurality of sacrificial patterns 410, the first charge storage film 144A, and the second charge storage film 144B.

Next, a plurality of gate electrodes (GSL, WL1, WL2~WLn, SSL) may be formed on the blocking insulating film 146. A plurality of gate electrodes (GSL, WL1, WL2~WLn, SSL) may be formed to fill a region in which a plurality of sacrificial patterns 410 are removed. Accordingly, the blocking insulating film 146 may be also interposed between the insulating pattern 110 and each of the gate electrodes (GSL, WL1, WL2~WLn, SSL).

Next, referring to FIGS. 7 and 8, the isolation structure 150 may be formed within the word line cut region (WLC). Further, a plurality of bit lines (BL) may be formed on the mold structure (MS).

For convenience of explanation, since formation of the isolation structure 150 and a plurality of bit lines (BL) is similar to the formation process described above with reference to FIGS. 23 and 3, a further description thereof is not repeated here.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A nonvolatile memory device, comprising:
a mold structure comprising a plurality of insulating patterns and a plurality of gate electrodes alternately stacked on a substrate;
a semiconductor pattern penetrating through the mold structure and contacting the substrate;
a first charge storage film; and
a second charge storage film separated from the first charge storage film,
wherein the first charge storage film and the second charge storage film are disposed between each of the gate electrodes and the semiconductor pattern,
wherein each of the gate electrodes comprises a first recess and a second recess which are respectively recessed inward from a side surface of the gate electrodes, and
the first charge storage film fills at least a portion of the first recess, and the second charge storage film fills at least a portion of the second recess.

2. The nonvolatile memory device of claim 1, wherein the semiconductor pattern extends in a direction that intersects with an upper surface of the substrate, and
the first charge storage film and the second charge storage film are separated from each other in the direction.

3. The nonvolatile memory device of claim 1, wherein the first charge storage film comprises a first surface opposing each of the gate electrodes, and
the first surface is a convex shape in each of the gate electrodes.

4. The nonvolatile memory device of claim 3, wherein the first charge storage film further comprises a second surface opposing the semiconductor pattern, and
the second surface is in substantially parallel with a side surface of the semiconductor pattern.

5. The nonvolatile memory device of claim 3, wherein the first charge storage film further comprises a second surface opposing the semiconductor pattern, and
the second surface is a concave shape in a direction away from a side surface of the semiconductor pattern.

6. The nonvolatile memory device of claim 1, further comprising:
a blocking insulating film extending along a profile of the first and second recesses between the first and second charge storage films and each of the gate electrodes.

7. The nonvolatile memory device of claim 6, wherein the first and second charge storage films comprise silicon nitride, and the blocking insulating, film comprises silicon oxide or a high-k dielectric material having a dielectric constant greater than silicon oxide.

8. The nonvolatile memory device of claim 1, further comprising:
a tunnel insulating film extending along a side surface of the semiconductor pattern between the first and second charge storage films and the semiconductor pattern.

9. The nonvolatile memory device of claim 8, wherein the first and second charge storage films comprise silicon nitride, and the tunnel insulating film comprises silicon oxide or a high-k dielectric material having a dielectric constant greater than silicon.

10. The nonvolatile memory device of claim 1, wherein a width of the first charge storage film and a width of the second charge storage film are different from each other in a direction that intersects an upper surface of the substrate.

11. The nonvolatile memory device of claim 1, wherein a depth of the first charge storage film and a depth of the second charge storage film are different from each other in a direction that intersects a side surface of the semiconductor pattern.

12. The nonvolatile memory device of claim 1, wherein the first charge storage film and the second charge storage film respectively and independently store a charge.

13. A nonvolatile memory device, comprising:
a mold structure comprising a plurality of insulating patterns and a plurality of gate electrodes alternately stacked on a substrate,
wherein each of the gate electrodes comprises a first portion, a second portion and a third portion sequentially stacked on one another;
a semiconductor pattern penetrating through the mold structure and contacting the substrate;
a first charge storage film disposed between the first portion and the semiconductor pattern; and
a second charge storage film disposed between the third portion and the semiconductor pattern,
wherein a side surface of the first portion extends into the first portion further than a side surface of the second portion, and a side surface of the third portion extends into the third portion further than the side surface of the second portion.

14. The nonvolatile memory device of claim 13, wherein the side surfaces of the first and third portions oppose the semiconductor pattern and each have a concave shape.

15. The nonvolatile memory device of claim 13, further comprising:
a blocking insulating film extending along a profile of the side surfaces of the first to third portions between the first and second charge storage films and each of the gate electrodes.

16. The nonvolatile memory device of claim 15, wherein the blocking insulating film further extends along a side surface of each of the insulating patterns.

17. The nonvolatile memory device of claim 15, wherein the blocking insulating film further extends along a bottom surface of the first portion and an upper surface of the third portion.

18. A nonvolatile memory device, comprising:
- a mold structure comprising a first insulating pattern, a gate electrode, and a second insulating pattern sequentially stacked on a substrate;
- a semiconductor pattern penetrating through the mold structure and contacting the substrate;
- a first charge storage film; and
- a second charge storage film separated from the first charge storage film,
- wherein the first charge storage film and the second charge storage film are disposed between the gate electrode and the semiconductor pattern,
- wherein the gate electrode comprises a first recess that extends into the gate electrode further than a side surface of the first insulating pattern, and a second recess that extends into the gate electrode farther than a side surface of the second insulating pattern, and
- the first charge storage film fills at least a portion of the first recess, and the second charge storage film fills at least a portion of the second recess.

19. The nonvolatile memory device of claim 18, further comprising:
- a blocking insulating film extending along a profile with respect to the side surface of the first insulating pattern, a side surface of the gate electrode, and the side surface of the second insulating pattern between the first and second charge storage films and the gate electrode.

20. The nonvolatile memory device of claim 18, wherein the first recess exposes a portion of an upper surface of the first insulating pattern, and the second recess exposes a portion of a bottom surface of the second insulating pattern.

* * * * *